United States Patent [19]
Angelle et al.

[11] 3,936,819
[45] Feb. 3, 1976

[54] AMPLIFIER FOR ANALOGUE SIGNAL SAMPLES WITH AUTOMATIC GAIN CONTROL, AND CIRCUIT FOR DIGITISATION OF SUCH SAMPLES

[75] Inventors: Philippe Angelle, Thouare; Georges Lefevre, Nantes, both of France

[73] Assignee: Societe D'Etudes, Recherches Et Constructions Electroniques Sercel, Carquefou, France

[22] Filed: Jan. 10, 1973

[21] Appl. No.: 322,333

[30] Foreign Application Priority Data
Jan. 11, 1972  France .................... 72.00799

[52] U.S. Cl. ............... 340/347 AD; 324/115; 330/9
[51] Int. Cl.² ........................................ H03K 13/02
[58] Field of Search.... 340/347 AD; 324/99 D, 115, 324/116; 330/9

[56] References Cited
UNITED STATES PATENTS

| | | | |
|---|---|---|---|
| 2,569,927 | 10/1951 | Gloess et al. ............... | 340/347 AD X |
| 2,730,676 | 1/1956 | Barker ..................... | 340/347 AD X |
| 2,832,827 | 4/1958 | Metzger .................... | 340/347 AD |
| 2,969,535 | 1/1961 | Foulkes ..................... | 340/347 AD |
| 3,049,701 | 8/1962 | Amdahl et al. ............... | 340/347 AD |
| 3,170,153 | 2/1965 | Brooks ...................... | 340/347 AD |
| 3,283,319 | 11/1966 | Kaneko ..................... | 340/347 AD |
| 3,699,567 | 10/1972 | Kiyasu et al. ................ | 340/347 AD |
| 3,703,002 | 11/1972 | Van Saun.................... | 340/347 AD |

*Primary Examiner*—Charles D. Miller
*Attorney, Agent, or Firm*—Alan H. Levine

[57] ABSTRACT

An electronic device for amplifying, with automatic gain control by discrete values, analogue signal samples and thereafter preferably effecting analogue-to-digital conversion of the samples, consists of an amplifier circuit, a comparator circuit, and a delay store circuit. The amplifier has a basic gain during a gain control or gain ranging operation, and supplies an output sample amplified with sufficient gain to bring it into the region of a predetermined voltage. The comparator circuit compares the output of the amplifier circuit with a reference and supplies an output in accordance with the result of the comparison. For analogue-to-digital conversion the amplifier circuit supplies for an input signal U an output signal 2U − VQ, where VQ is the quantification voltage, or, in other embodiments a signal 2U.

28 Claims, 19 Drawing Figures

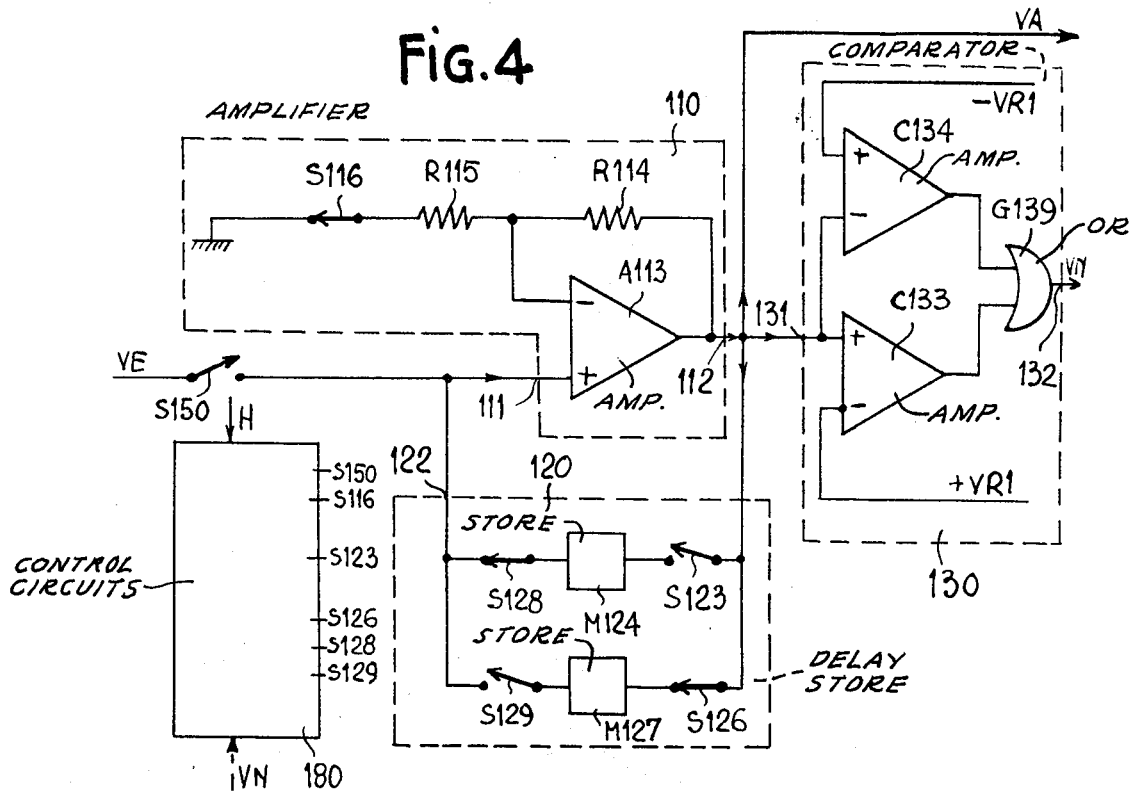
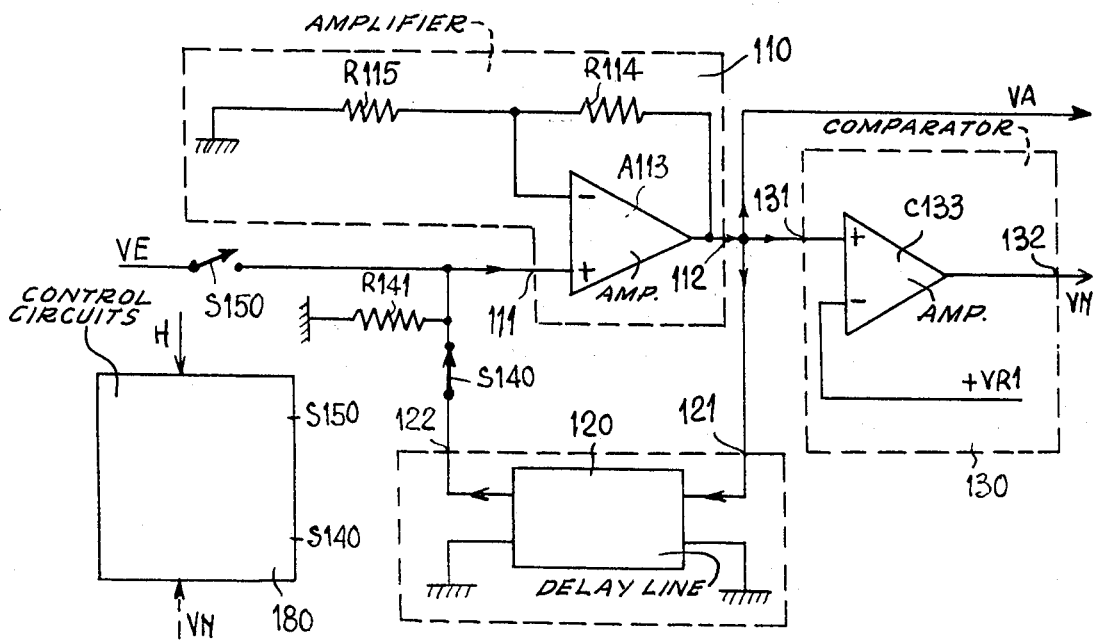

AMPLIFIER FOR ANALOGUE SIGNAL SAMPLES WITH AUTOMATIC GAIN CONTROL, AND CIRCUIT FOR DIGITISATION OF SUCH SAMPLES

BACKGROUND OF THE INVENTION

The present invention concerns the digitisation of analogue signals or samples of such signals for obtaining digital signals having a floating decimal point, and to the amplification of such signals or samples prior to digitisation.

The substantial progress made in recent times in the utilisation of digital information, both in the sphere of displaying such information and in that of its processing, has made itself felt in a general tendency to code in digital form the analogue signals supplied by numerous sources of widely varying nature. A typical example, to which reference will be made hereinafter, is that of seismic applications; pickup transducers, such as geophones, are distributed over prospecting sites for providing analogue seismic signals following an artifically produced quake, and these analogue signals are converted into digital signals for their utilisation.

Floating decimal point digital signals are formed of two parts, a characteristic and a mantissa, each comprising elementary binary information or bits. The notation weight assigned to each bit of the characteristic or mantissa is supplied either by the rank of this bit in time (serial digitisation) or by the fact that each bit is provided on a particular connection assigned to a predetermined notation weight (parallel digitisation), or by a combination of these two types of coding.

In a general manner, the digitisation of an analogue signal comprises taking samples of this signal which are sufficiently close together to constitute in their entirety a faithful representation of the analogue signal. Digitisation then comprises measurement of the amplitude and possibly the sign of each of these samples, the result of this measurement being expressed in the form of a digital signal. This method of digitisation comprising simply the measurement of each sample is called fixed point representation.

When the dynamic range of analogue signals is high, their digitisation with fixed point necessitates a large number of binary positions. This solution is therefore found to be complicated and difficult to employ.

To avoid these two disadvantages, it has already been proposed to carry out first of all an amplification of each sample with a controllable binary gain among a plurality of predetermined values for bringing the amplitude of each amplifier sample to the lower neighbourhood of a fixed value, called dull scale signal, and then to effect an analogue-to-digital conversion relative to this full scale signal of the sample thus amplified. This solution, called floating decimal point digitisation, is employed particularly in our French Pat. Specification No. 1,522,367.

Under these conditions, the digital signal obtained at the output of the analogue-to-digital conversion, comprising the mantissa, is a representation of the sample amplified with binary gain. This binary gain, expressed separately in digital form, is the characteristic which defines the position of the decimal point in the mantissa. In a general manner, the full-scale voltage is selected such that the binary gain is always greater than unity, and therefore the movement of the point is always made in the same direction; consequently, the sign of the characteristic remains always the same and may be suppressed.

On the other hand, the sign of the analogue signals, and therefore of the samples, is considered as forming part of the mantissa.

In the following description, "gain control" or gain ranging will be the operation consisting of amplifying a sample with an adequate binary gain to bring the amplified sample to the lower vicinity of a full-scale voltage, and "conversion" will be the operation consisting of effecting an analogue-to-digital conversion of the sample thus amplified.

Fixed point representation of analogue signals of definite polarity and rather low dynamic range forms the subject of a technical solution of considerable simplicity set forth in French Pat. Specification No. 978,054. However, the device proposed in that specification does not make it possible to digitise, in floating point, analogue signals of high dynamic range and does not possess high precision With regard to floating point digitisation, current technique is to effect separately gain control of samples in an amplifier having binary gain control of samples in an amplifier having binary gain control by discrete values (binary gain ranging) and then to carry out the measurement of each sample thus amplified in an analogue-to-digital converter.

The two important parameters for floating point digitisation are the sampling frequency, which is related to the speed required for the electronic circuits, and the mean relative precision of measurement defined by a number of exact numerical digits, which depends particularly on the ratio between the amplitude of the amplified sample and the amplitude of the full scale signal. It was obvious that the precision of measurement may be all the greater, the higher is the number of discrete values of the gain, for analogue signals of given dynamic range.

Sample amplifiers having automatic gain control and the analogue-to-digital converters generally employed in the art are all the more complicated, the higher is the number of discrete gain values and the number of desired significant digits, respectively.

It follows more particularly that the bulk and electric power consumption of the devices of the prior art are high. When a large number of different analogue signals have to be processed, it is possible either to employ an individual floating point digitisation device for each signal, which is an expensive solution, giving rise to difficult problems when these different signals have to be compared after digitisation, or to multiplex the different analogue signals for applying them to a single floating point digitisation channel, which has the disadvantage of multiplying the speed required for this single digitisation channel by the number of simultaneouslymultiplexed analogue signals.

The two types of devices of the prior art have a bulk and electric power consumption such that it is not possible to use them wherever desired. This is a considerable disadvantage for applications (seismic applications, for example) in which a plurality of pickups are distributed over the ground, the signals provided by these pickups being ditigised on the operational sites. Under these conditions, the digitisation devices of the prior art have to be collected together in the vicinity of the sources of power, such as laboratory trucks, while the pickups are dispersed at some distance.

SUMMARY OF THE INVENTION

An object of this invention is to provide a particularly simple electronic device for carrying out amplification with automatic gain ranging of samples of analogue signals.

Another object is to provide such a device which will also carry out analogue-to-digital conversion of each amplified sample.

Another object of the invention is to provide a device which has a smaller bulk and electrical power consumption compared with prior art devices.

A further object of the invention is to provide a device which can be readily incorporated with transducer pickups without greatly increasing their physical dimensions or electrical power consumption.

This invention provides an electronic device for the amplification with automatic gain control by discrete values of analogue signal samples before analogue-to-digital conversion of each amplified sample, with a view to the floating point digitisation of said samples. The device comprises an amplifier circuit having a predetermined basic gain between a signal input and an output, and a delay store circuit adapted to supply as output signal its input signal after a time interval, and having its input connected to the output of the amplifier circuit and its output connected to the signal input of the amplifier circuit. A comparator circuit compares the output signal of the amplifier circuit with a reference signal, and supplies one or another output level according to the result of this comparison. By means of this electronic device, it is possible to amplify each input sample successively several times until its amplitude approaches or exceeds that of the reference signal, the total gain applied to the sample by the device being supplied in the form of a digital signal in series to the output of the comparator circuit, and the sample amplified with this total gain being available, at the output of the amplifier circuit, for analogue-to-digital conversion. If the samples are of any polarity, the comparator circuit is adapted to function with signals of both polarities.

Preferably, such an electronic device also carries out the digital conversion of each sample thus amplified. For this purpose, the amplifier circuit and the comparator circuit each have two different operational states, a first state which is that defined above for the amplification of samples of analogue signals with automatic control by discrete values, and a second state for the analogue-to-digital conversion.

In a first embodiment, the amplifier circuit, during its second operational state, has a second gain for supplying either the difference between the analogue signal present at the signal input of the amplifier circuit, amplified with the second gain, and a quantification signal, or only the analogue signal applied to the said signal input amplified with this second gain in a manner controlled by a polarity signal. In its second state, the comparator circuit comprises a second value of its reference signal, and then supplies the digital conversion signals as well as the polarity signal applied to the amplifier circuit.

In this manner, the amplifier circuit supplies either the difference between the analogue sample applied to its signal input, amplified with a gain (in general equal to 2), and the quantification signal, or the sample itself amplified with the gain, according to whether the sample before amplification is higher or lower than the second reference value of the comparator circuit. This modification is particularly applicable when the samples are of predetermined, constant polarity.

In a second embodiment for carrying out analogue-to-digital conversion, the amplifier circuit comprises two quantification signals having the same amplitude and opposite polarities; the second reference value of the comparator is zero, and the amplifier circuit supplies systematically the difference between the analogue signal applied to its input signal amplified with a second gain and the quantification signal of the same polarity, the polarity suitable for the subsequent operation of the amplifier circuit being controlled off the output of the comparator circuit.

Very advantageously, in this second modification, the comparator circuit in its first state has two first reference values having the same amplitude and opposite polarities. Moreover, the analogue-to-digital conversion properly so called is then proceded or followed by a sign determination, which may be made in a very simple manner as will be seen later.

The invention will now be described in more detail, by way of example, with reference to the accompanying drawings, in which:

FIG. 4 is the electric circuit diagram of another modification of the device according to FIG. 2;

FIG. 5 is the electric circuit diagram of another gain control device embodying the invention for analogue signals of constant predetermined polarity, in which the delay store circuit comprises a delay line;

Figure 7:
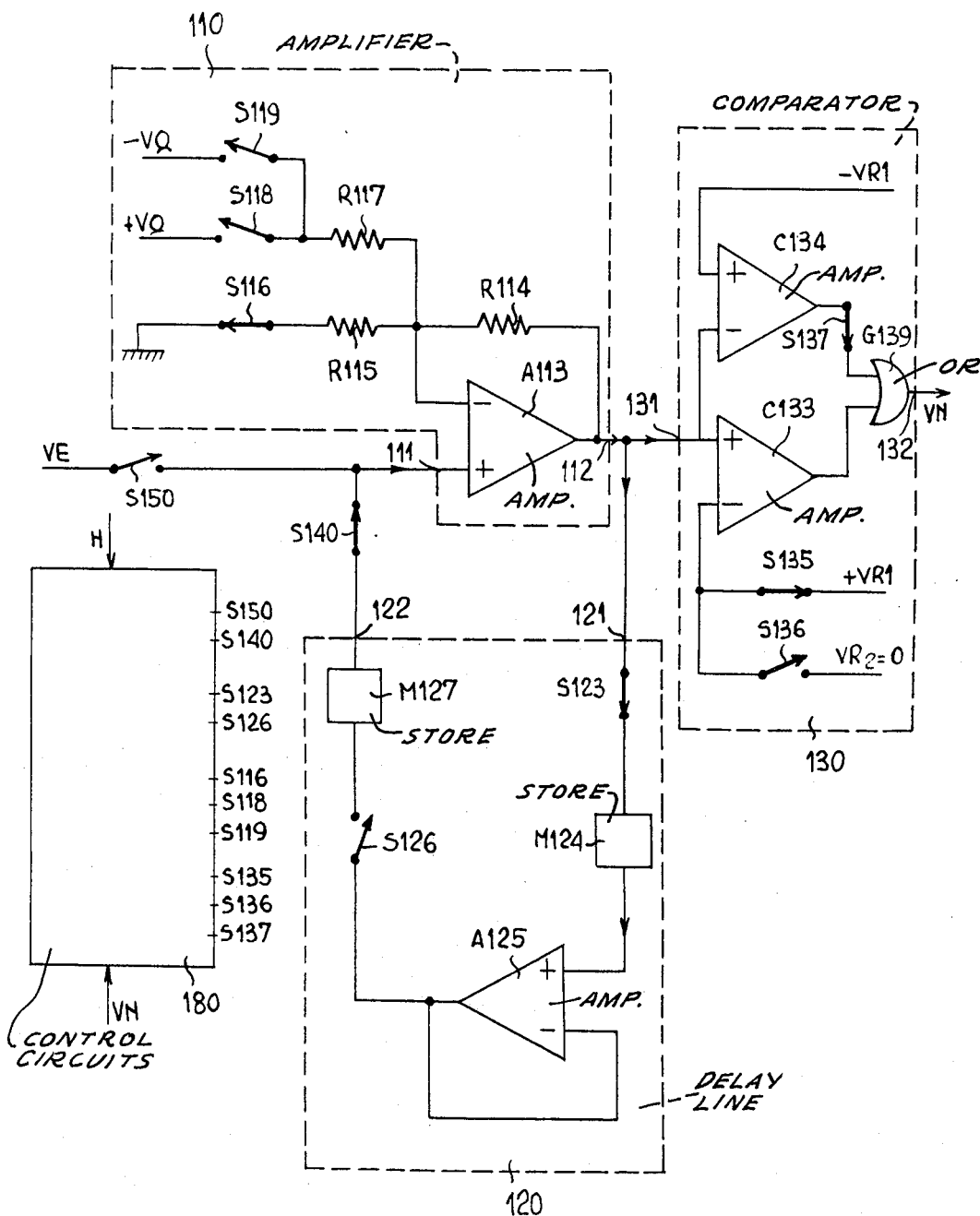
FIGS. 7 to 7B illustrate the electric circuit diagram and operation of a floating point digitiser device embodying the invention for analogue signals of any polarity, this device operating like that of FIG. 2 for the gain control.
Figure 7A:
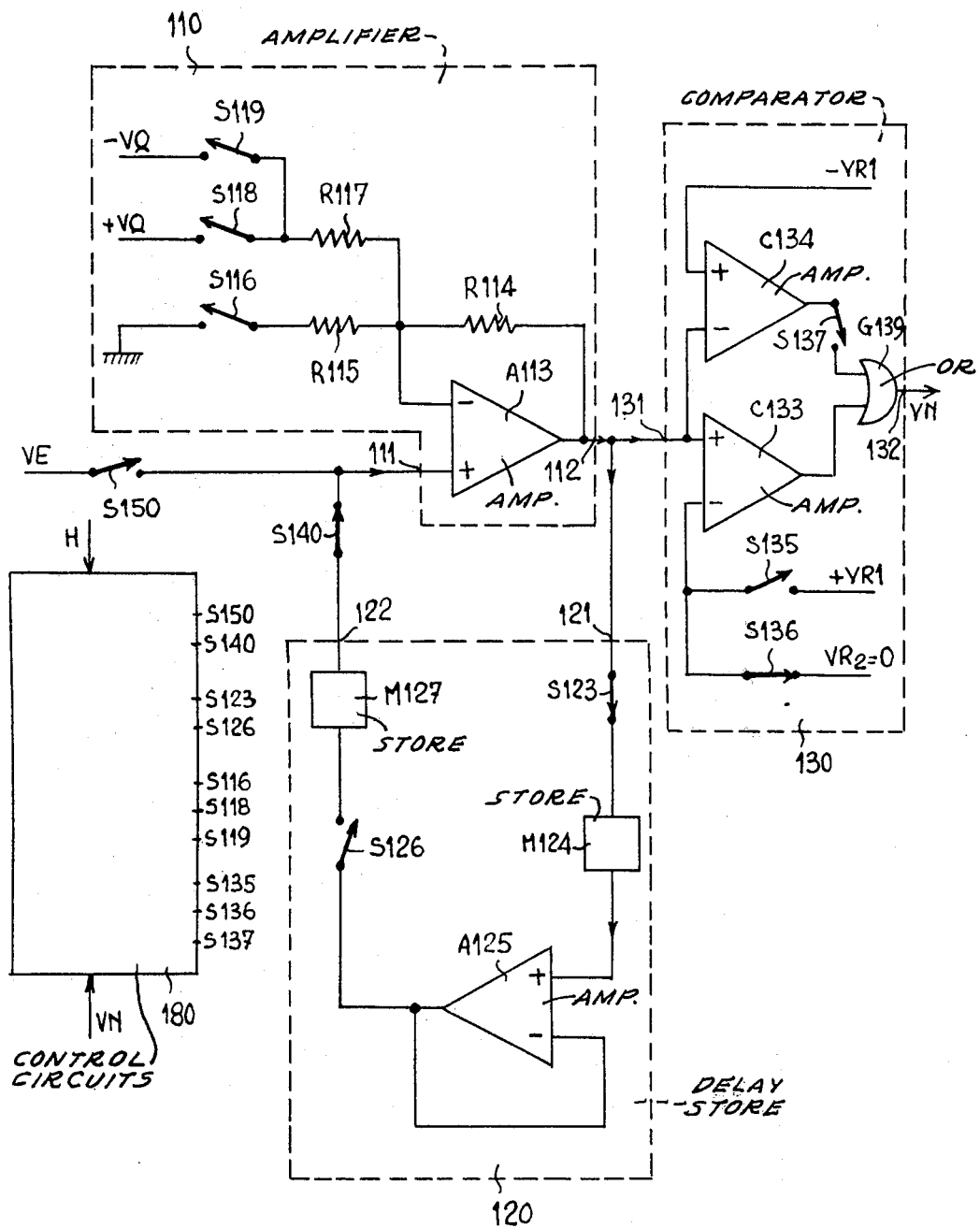
Figure 7B:
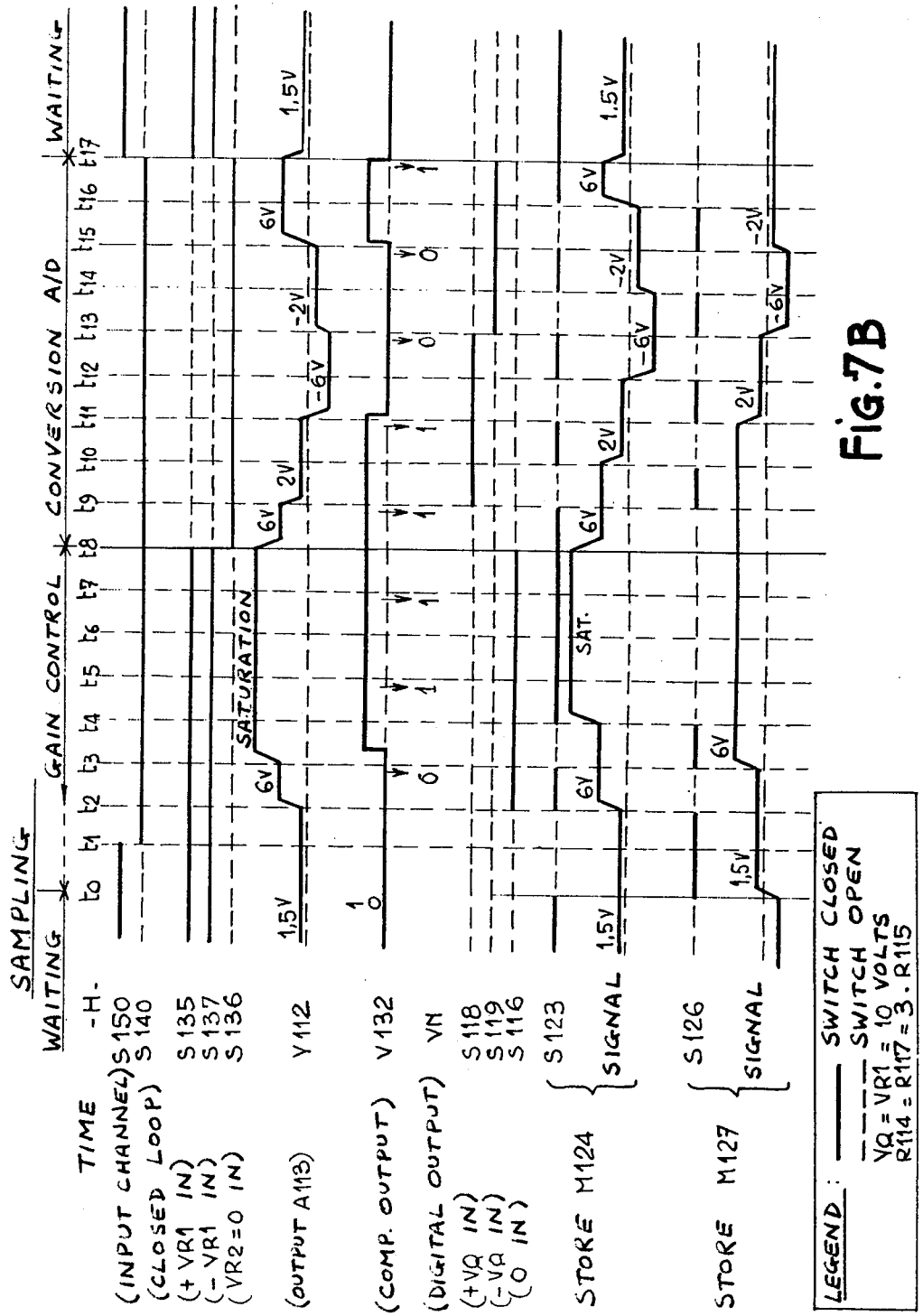
Figure 9:
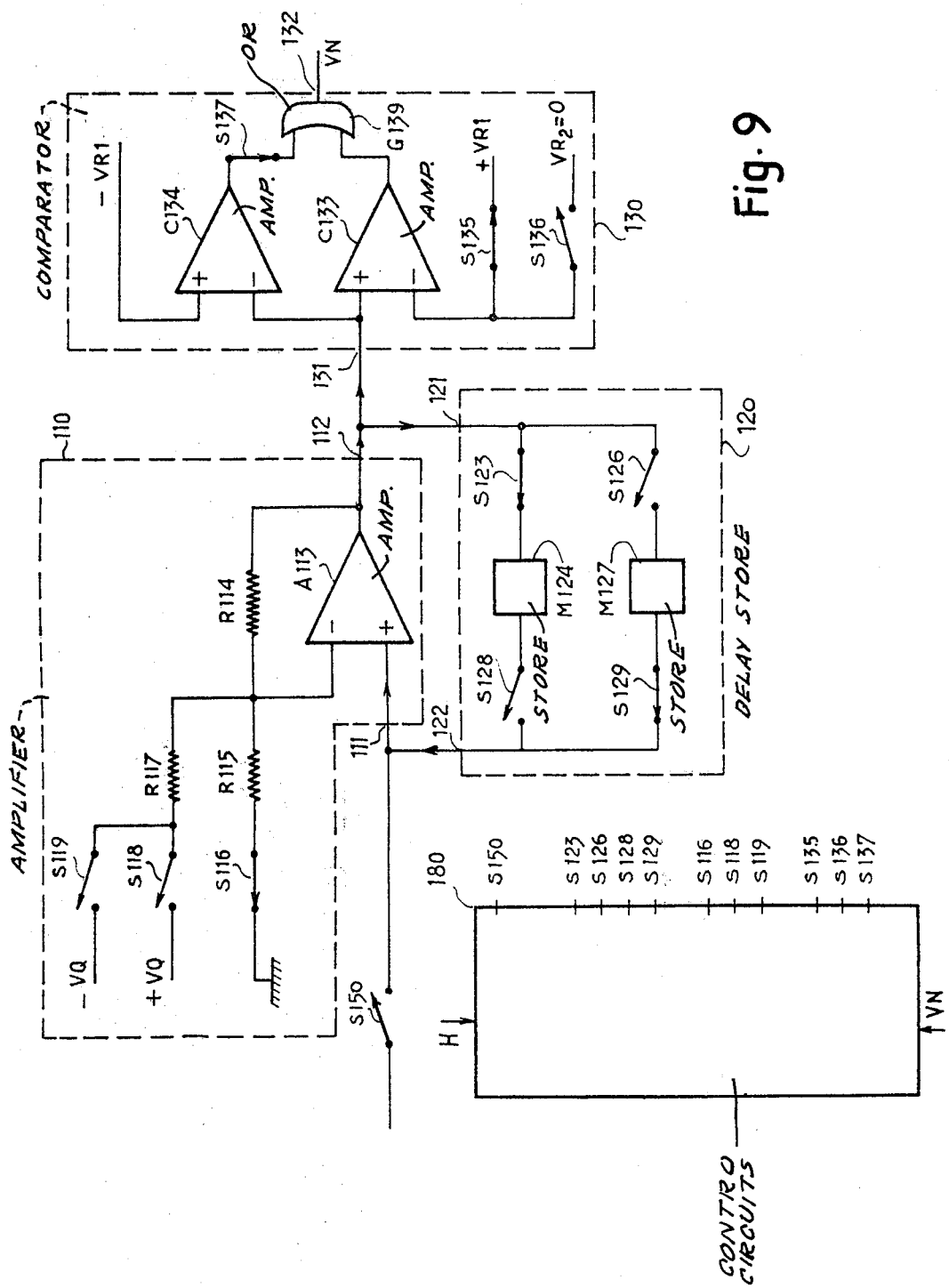
Figure 9A:
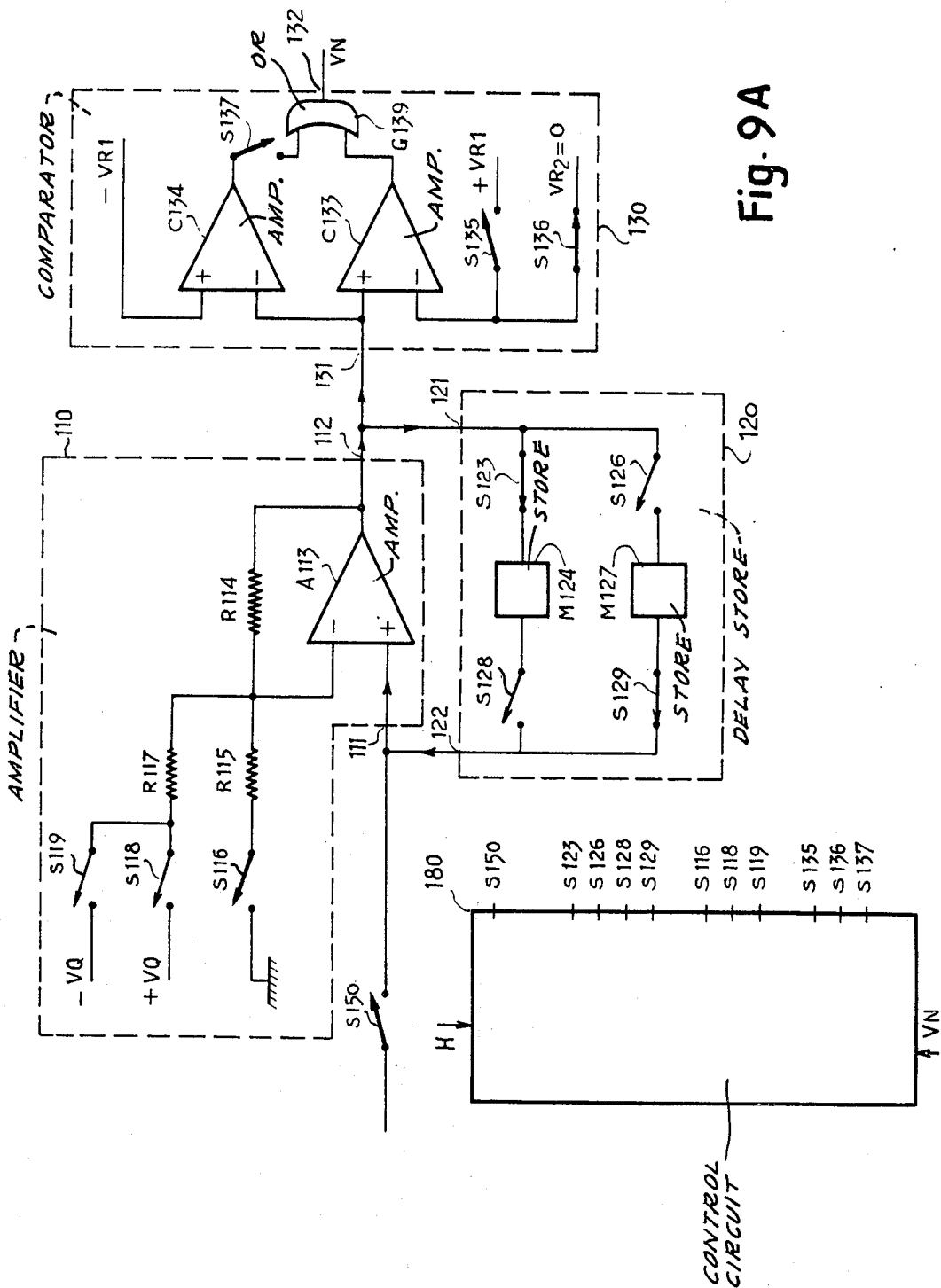
Figure 9B:
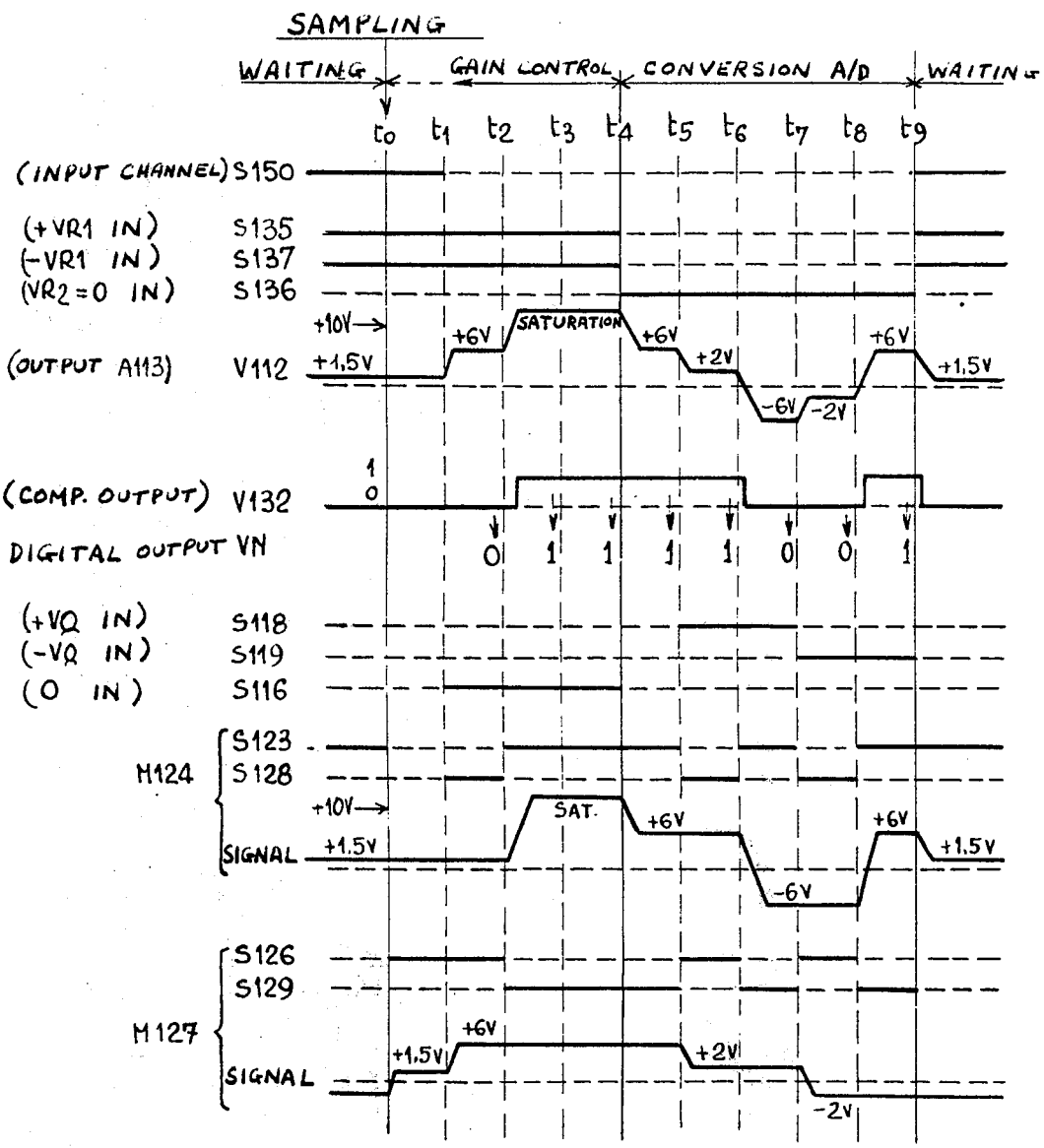
Figure 10:
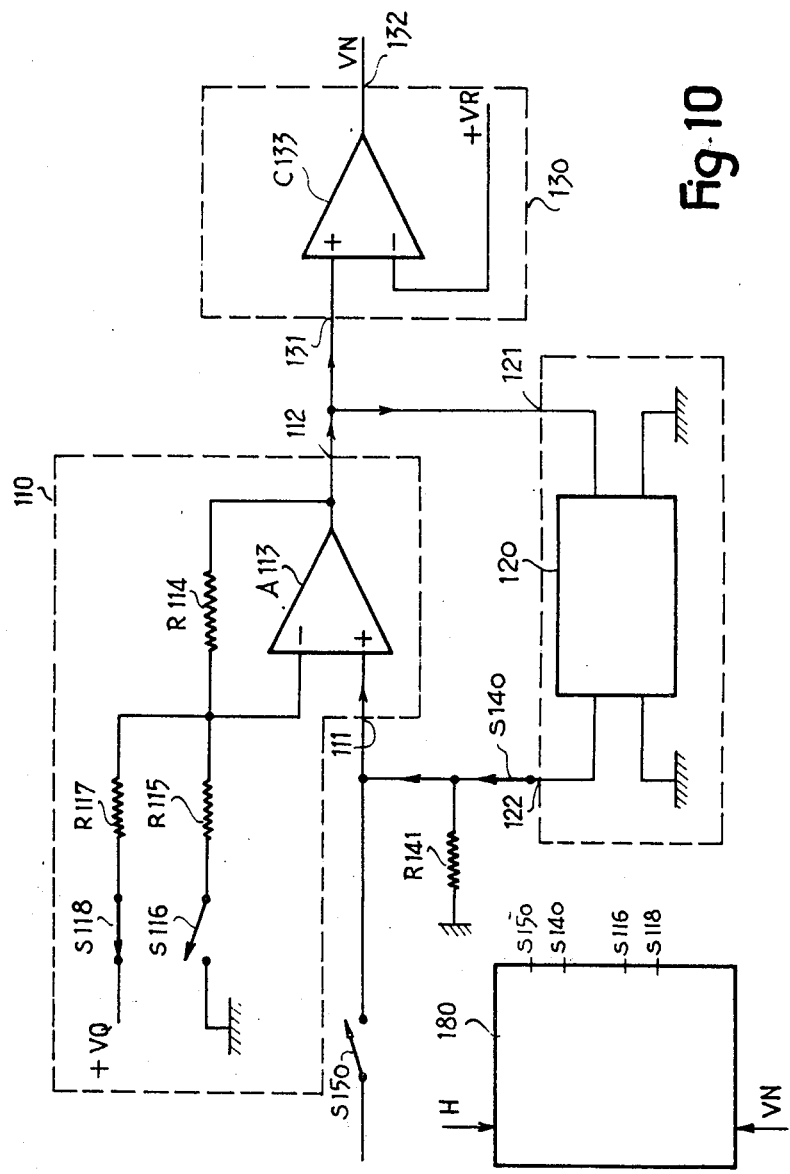
Figure 10A:
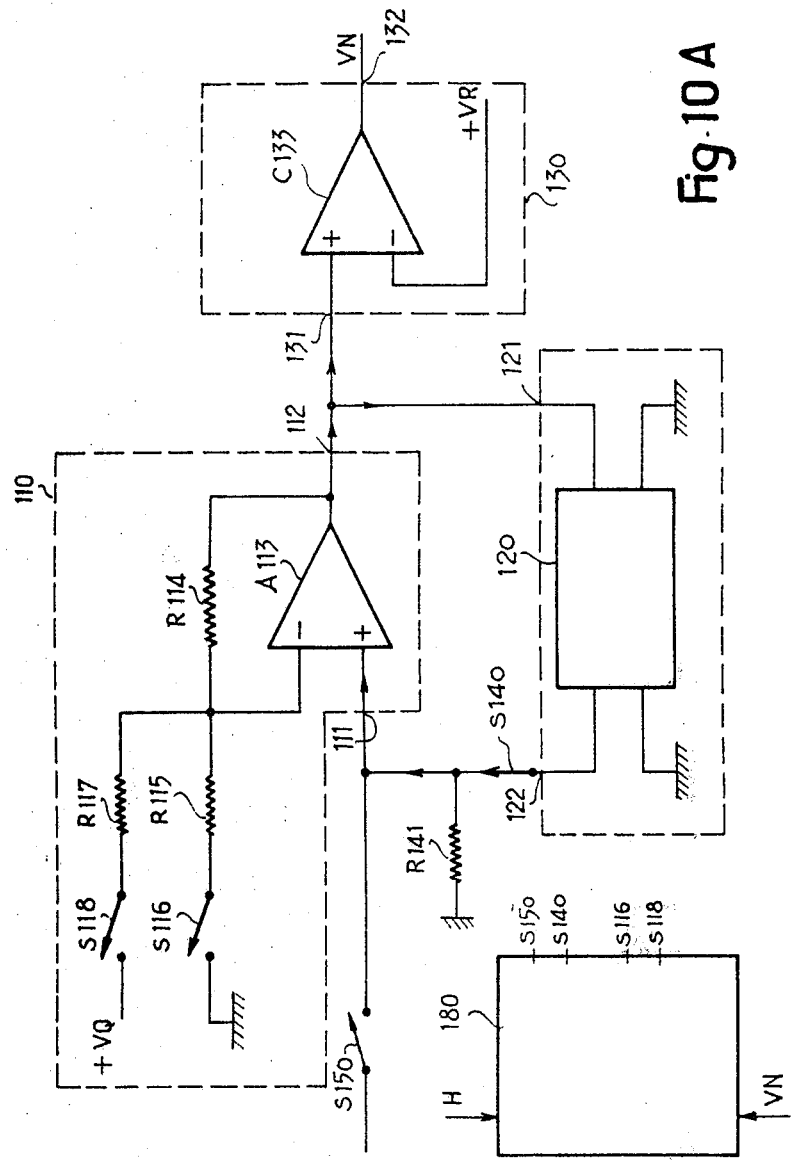
Figure 10B:
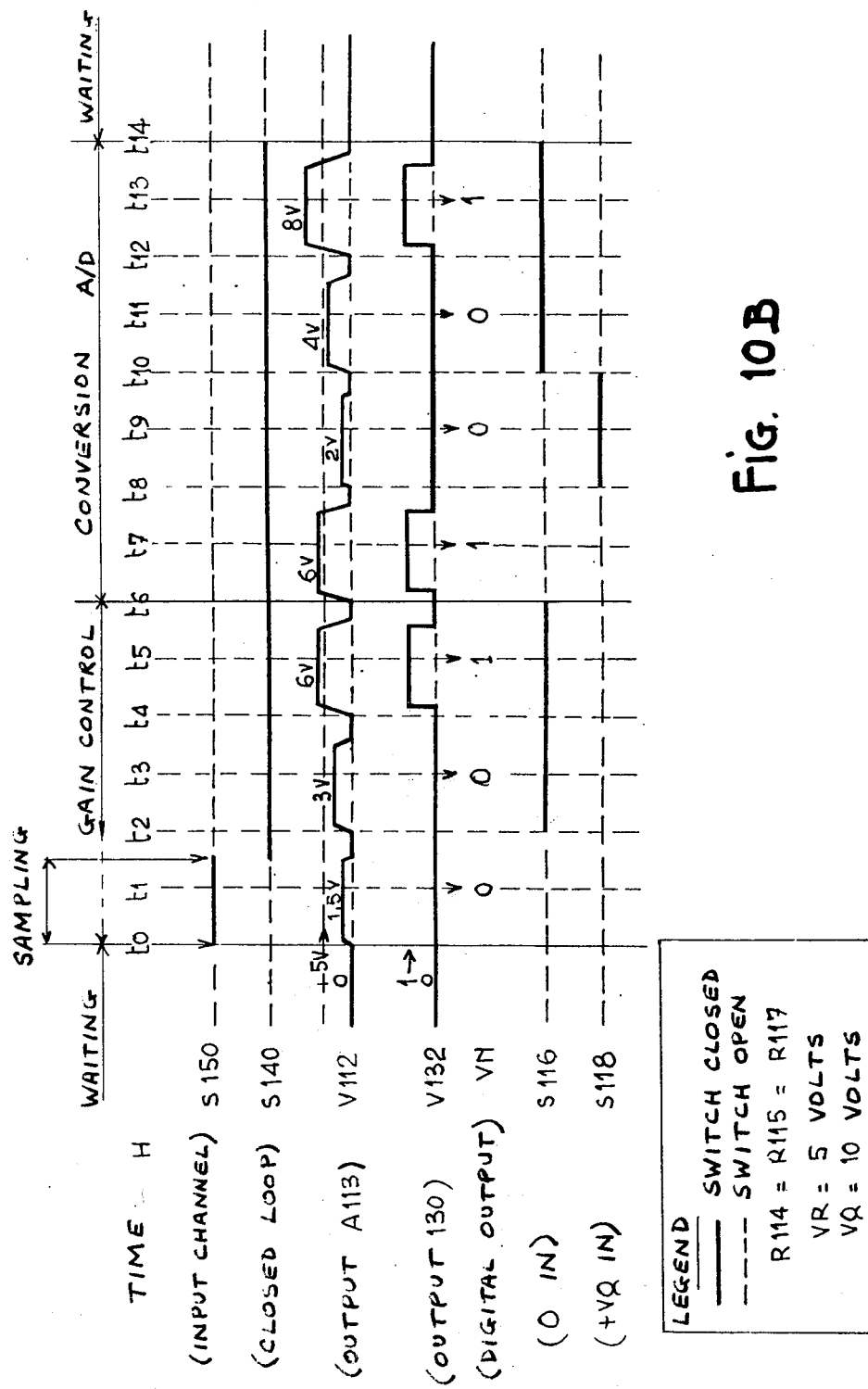

FIGS. 9 and 9B illustrate the electric circuit diagram and operation of another modification of the device of FIGS. 7 to 7B, this device operating like that of FIG. 4 for gain control; and FIGS. 10 to 10B illustrate the electric circuit diagram and operation of another embodiment of a floating point digitiser embodying the invention for analogue signals of predetermined constant polarity, this device operating like that of FIG. 5 for gain control.

DESCRIPTION OF THE PREFERRED EMBODIMENTS

In the figures, numerous switches are shown diagrammatically. When the sampling frequencies are very slow, these switches may be mechanical. Most of the time, these switches consist of semiconductors, advantageously field effect transistors. All the switches shown are controlled switches. The control lines are not shown. It is considered to be known to the person versed in the art to generate control signals for the field effect transistors according to a desired time sequence from time signals H. The control circuits used for this purpose have been shown very diagrammatically in the figures with the same reference number 180.

Figure 1:
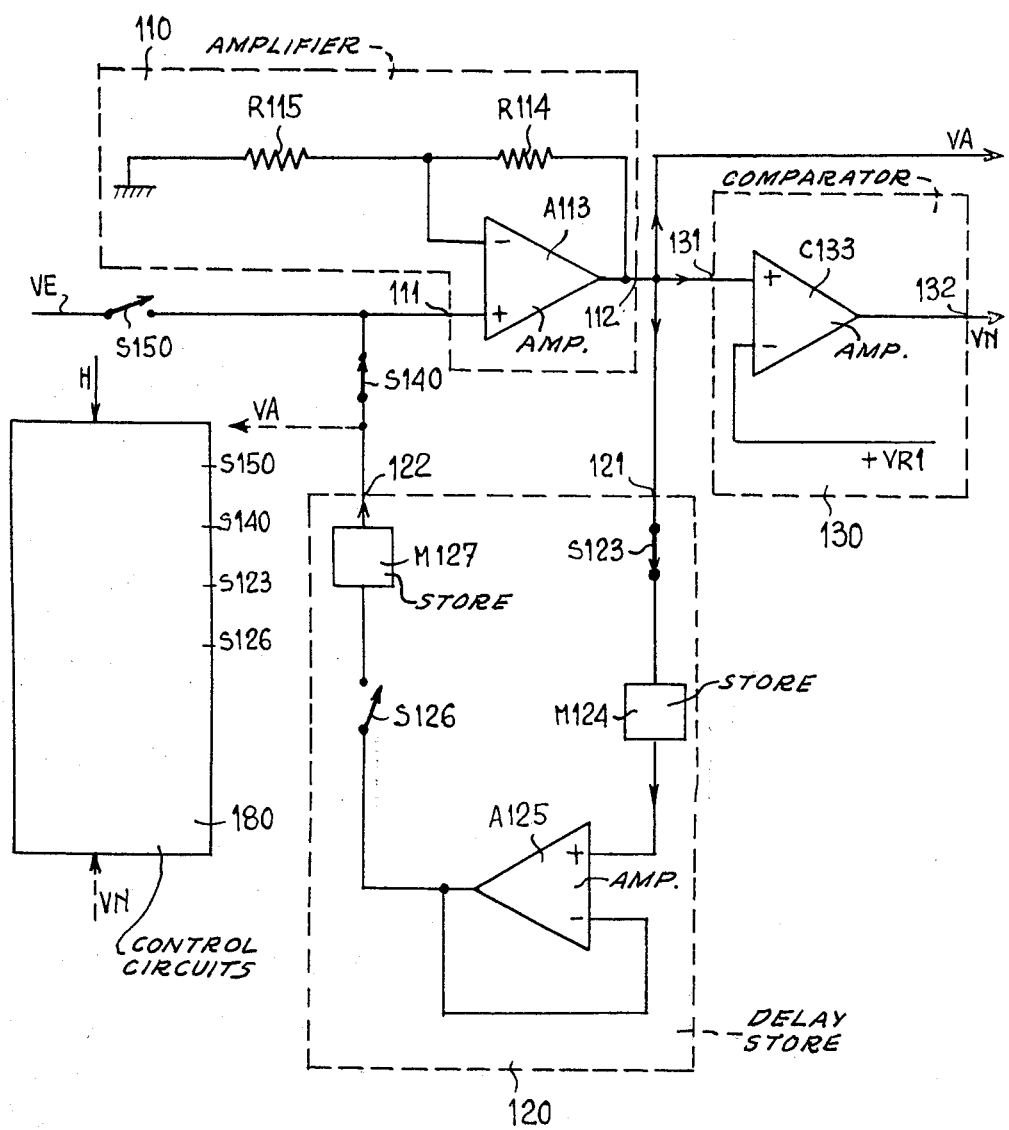
FIG. 1 is an electric circuit diagram of a gain control device embodying the invention for analogue signals of definite constant polarity, in which the delay store circuit comprises analogue stores.

FIG. 1 illustrates one embodiment of the invention showing a device for amplifying with automatic gain control by discrete values of samples of analogue signals of definite polarity.

This FIG. 1 comprises an amplifier circuit shown in the dashed line box having the general reference 110, a delay store shown in the dashed line box having the general reference 120, and a comparator circuit shown in the dashed line box having the general reference 130.

The amplifier circuit 110 comprises a signal input 111 and a signal output 112, called more briefly output 112. The amplifier circuit 110 is adapted at least to supply at its output 112 the analogue signal or the analogue sample applied to its signal input 111, amplified with a definite basic gain.

The delay store circuit 120 comprises an input 121 connected to the output 112 of the amplifier circuit, and an output 122 adapted to be connected to the signal input 111 of the amplifier circuit 110 directly or by means of a controlled switch S 140.

The input signal 111 of the amplifier circuit 110 may be connected to an input channel VE by means of a controlled switch S 150.

The comparator circuit 130 comprises an input 131 connected for example directly to the output 112 of the amplifier circuit 110. Finally, the comparator circuit 131 comprises an output 132 connected to the digital signals output channel VN.

These notations will be used for all the other electric circuit diagrams of the drawings. Unless stated to the contrary, in the given electric circuit diagrams, the switches are shown in their respective positions at the commencement of amplification with automatic gain control.

In other respects, there will be described first of all, with reference to FIGS. 1 to 5, devices embodying the invention for amplification with automatic gain control by discrete values. The electric circuit diagrams of these devices will be described and the embodiment variations will be mentioned. Their operation will be described in a general manner. Time diagrams illustrating in a more precise and detailed manner the operation of these gain control devices are given with reference to the description of the corresponding devices of the other figures, which are also designed to carry out analogue-to-digital conversion.

A first embodiment of the amplifier device with automatic gain control will now be described with reference to FIG. 1 to illustrate in a simple manner the operation of this gain control.

The switch S 140 being closed, the amplifier circuit 110 and the delay store circuit 120 co-operate for causing an analogue signal sample to circulate; this sample is amplified with a predetermined basic gain in the amplifier circuit for its duration, and the sample thus amplified is supplied, after a time interval, by the delay store circuit 120 to the amplifier circuit 110. This procedure is repeated until the switch S 140 is opened for preventing the arrival of the preceding amplified sample at the amplifier circuit 110. Of course, the delay time interval supplied by the delay store circuit 120 must be definitely greater than the useful duration of each sample, taking into account more particularly the response time of the amplifier circuit. (Useful duration of each signal is called that during which the output signal of the comparator circuit is taken into consideration as digital information.)

The comparator circuit 130 is connected, for example directly, to the output of the amplifier circuit 110 for comparing with a reference signal the sample obtained on each amplification.

In normal operation, at the most one of the two switches S 140 and S 150 is closed; when the switch S 150 is closed, the analogue signal present on the input channel VE is applied to the device. Taking a sample is effected by opening the switch S 150, or preferably by opening another switch situated downstream in a manner to be described later with reference to FIG. 2.

As soon as the switch S 150 is open, during or immediately after sampling, the switch 140 is closed to permit circulation of the analogue signal sample taken.

In FIG. 1 the analogue samples are assumed to be of definite constant polarity. The switch S 140 is shown in the closed position for the purpose of a description of the operation of the automatic gain control device after the sampling operation described above.

In a general manner, in all the succeeding figures, the switch S 140 connecting the output 122 of the store circuit 120 to the input 111 of the amplifier circuit 110 will always be shown in the closed position unless stated to the contrary.

In FIG. 1, the amplifier circuit 110 is formed of a differential amplifier A 113, whose non-inverting input (illustrated by the + sign) is connected directly to the input line 111 of the amplifier circuit 110. The inverting input (−) of the differential amplifier A 113 is connected by a feedback resistance 114 to the output of the differential amplifier A 113. This inverting input (−) is also connected to earth by a resistance R 115. Finally, the output of amplifier A 113 supplies the output line 112 of the amplifier circuit.

In FIG. 1, the delay store circuit 120, which has an input line 121 and an output line 122, comprises in series with its input and output successively a first controlled switch S 123, a first static analogue store such as a capacitor M 124, a unit gain amplifier A 125, a second controlled switch S 126, and a second static analogue store, such as a capacitor M 127.

By "static analogue store" is meant a component capable of retaining an analogue signal for a substantial time. It is known that a capacitor charged by a very high impedance can perform this function. In the present description, the words "static analogue store" are in this sense opposite to the words "delay (analogue) store", which correspond to the application of a delay time interval to an analogue signal, without the said analgoue signal being stored in a durable manner in a static analogue store. analogue In FIG. 1, it is clear that in the delay store circuit 120, the delay time interval is obtained in a manner controlled by the switches S 123 and S 126 by means of the transfer of analogue samples between the first static analogue store M 124 and the second static analogue store M 127. As will be seen later, the store circuit 120 may be constructed in a different manner.

When the first and second static analogue stores M 124 and M 127 are formed by capacitors, it is clear that their respective utilisation impedances are provided by the differential amplifiers A 125 and A 113, whose input impedances are high. In FIG. 1, the function of the unit gain amplifier A 125 is essentially to provide a high utilisation impedance to the first store M 124.

The necessary condition for the circuit 120 of FIG. 1 to function as delay store circuit is that one end and only of the two controlled switches S 123 S 126 should be closed at any instant. In FIG. 1, the switch S 123 is shown closed and the switch S 126 opened. For all the succeeding figures in which the delay store circuit comprises two static analogue stores, these two switches are shown in their position at the commencement of gain control.

In FIG. 1, the comparator circuit 130 comprises a differential amplifier connected as comparator C 133, the + input of this amplifier being connected to the input 131 of the comparator circuit, the − input being connected to a reference voltage + VR 1, and the output of the comparatoramplifier C 133 being connected to the output line 132 of the comparator circuit 130. (It is recalled that a comparator-amplifier is a differential amplifier adapted to supply a substantially zero signal when the signal to be compared is algebraically less than the reference voltage + VR1, and to supply a high output voltage, called saturation voltage, when the analogue signal to be compared has the same polarity as the reference signal and has a greater amplitude than that of the said reference signal. The two output levels possible for a comparator-amplifier will be called respectively zero level and saturation level.)

In FIG. 1, the input 131 of the comparator circuit 130 is connected directly to the output 112 of the amplifier circuit 110. It is to be understood for FIG. 1 and the rest of this description that the input 131 of the comparator circuit 130, as a modification, may be connected to the output of the static store M 124, or again to the output of the unit gain amplifier A 125, the signals appearing at these outputs being normally identical with those at the output of the amplifier circuit 110.

Automatic gain control is effected while taking into account the amplitude of the samples, but not their polarity. Given that the comparator circuit 130 of FIG. 1 can make comparisons only for one polarity, which is that of the reference voltage + VR 1, it is clear that the device of FIG. 1 functions with analogue samples of definite constant polarity, which must be the same as that of the reference signal + VR 1.

The operation of the device of FIG. 1 will now be described in a general manner. For this purpose, it will be assumed, by way of example, that the basic gain of the amplifier circuit 110, defined by the values of the resistances R 114 and R 115 is equal to 2, this basic gain being most often a whole power of 2. It will also be assumed that a sample of amplitude U just taken in the analogue signal of the input channel VE is applied to the input 111 of the amplifier circuit 110 and that the amplitude of this sample is distinctly less than that of the reference signal + VR 1.

This sample of amplitude U is amplified by the amplifier A 113 with the gain 2, which therefore provides a signal 2.U applied simultaneously to the comparator circuit 130 and to the delay store circuit 120, the switch S 123 of the latter being closed.

If the amplified signal 2.U is less than the reference signal + VR 1, the output 132 supplies a zero level. If the amplified sample is greater than the reference signal + VR 1, the output 132 supplies a saturation level and the gain control operation is terminated, the total gain being 2 and the amplified sample with this total gain having the value 2.U.

If the gain control operation is not terminated at this instant, the amplified sample 2.U stored in the static store M 124 is transferred to the store M 127 via the unit gain amplifier A 125 by closure of the second controlled switch S 126, and simultaneous opening of the first controlled switch S 123 for respecting the aforesaid necessary condition. The switch S 126 remains closed for a certain time which defines the delay time interval supplied by the delay store circuit 120. The switch S 126 is then opened again and the switch S 123 closed. A fresh amplification then occurs in the same way as before in the amplifier circuit 110, which supplies a sample amplified with an amplitude 4.U. This operation is repeated until the output 132 of the comparator circuit 130 indicates saturation output level.

The number of successive zero levels of the comparator circuit 130 is a digital signal representative of the total gain applied to the initial sample. The sample, amplified with this total gain, is available at the output 112 of the amplifier circuit 110 towards an analogue output channel VA. After amplification, the sample in a modification may be picked up at the output of the first static store M 124 or at the output of the unit gain amplifier A 125.

The sample amplified with total gain, present in the analogue output channel VA at the moment at which gain control is terminated is, in most of the times applied to an analogue-to-digital converter having a full scale voltage Vco.

When the sample amplified with total gain is transmitted as just described, the reference signal + VR 1 is selected to be equal to the full-scale signal Vco of the converter divided by the basic gain, equal to 2 in this example, of the amplifier circuit 110. In this manner, the sample amplified with the total gain has an amplitude of between Vco/2 and Vco. This arrangement is possible for all the gain control methods described hereinafter and irrespective of the basic gain of the amplifier circuit during gain control.

Another modification can be used when the delay store circuit comprises two static analogue stores. The reference voltage + VR 1 is selected to be equal to the full scale voltage Vco of the analogue-to-digital conversion, and the sample having the total gain is taken at the amplifier input, that is to say at the output of the analogue store M 127. In this case, the last comparison supplying a saturation output level is made on the signal amplified with the global gain multiplied once too many by the basic gain of the amplifier circuit. The sample amplified with the total gain is the same as before, but the coding of the digital signals supplied to the output of the comparator circuit differs slightly, since in the second case and for the same initial sample, the number of zero levels at the output of the comparator is greater than unity. This modification is illustrated in FIG. 1 by an analogue output channel VA in short dashed lines.

The output of the comparator circuit 130 is connected to the output channel VN of the digital signals for supplying the elementary digital signals representative of the total gain.

Figure 2:
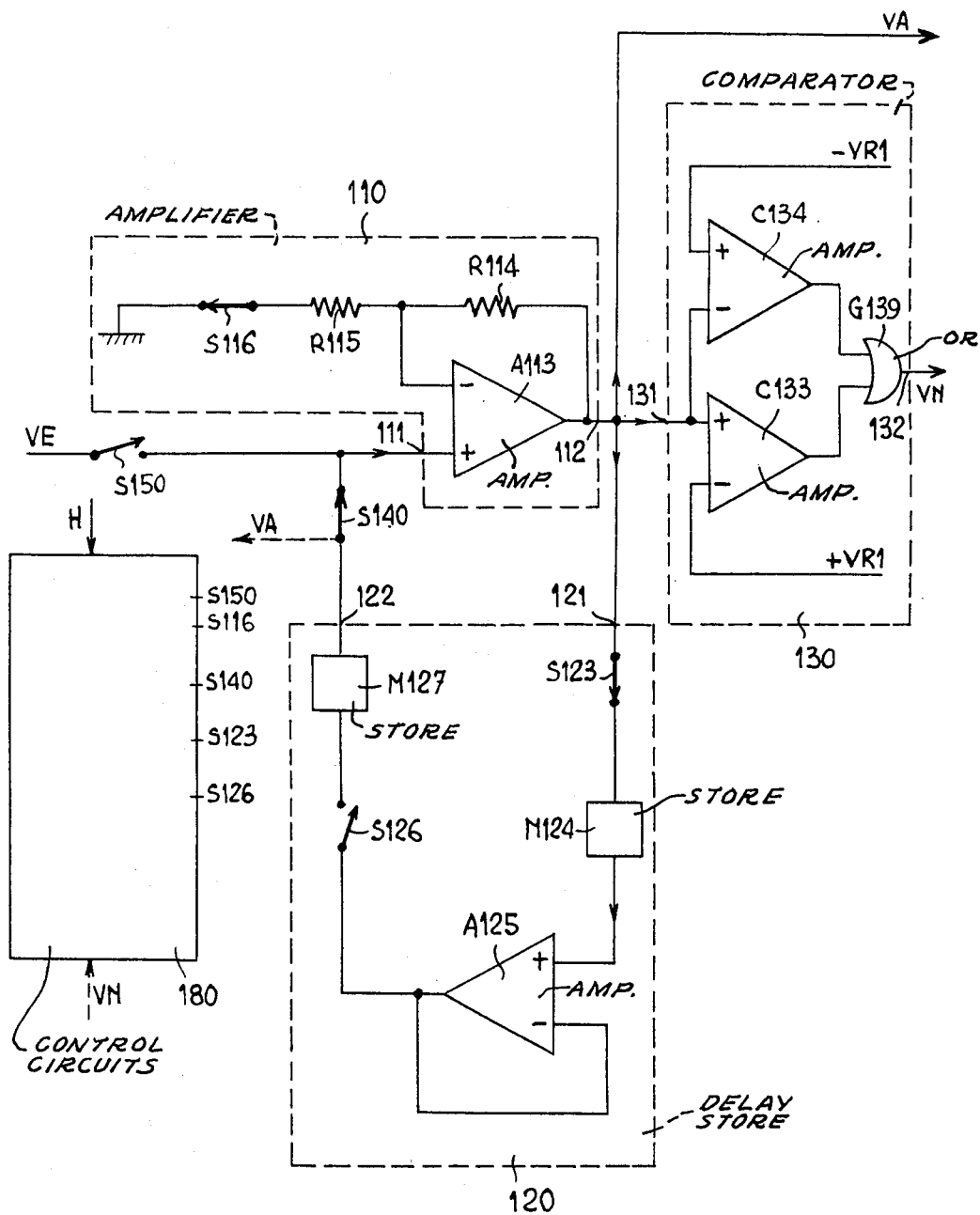
FIG. 2 is an electric circuit diagram of a gain control device similar to that of FIG. 1 for analogue signals of any polarity.

FIG. 2 illustrates an embodiment modification of the amplification device with automatic gain control by discrete values of FIG. 1. According to this modification, the comparator circuit 130 is adapted to compare its input signal with a reference amplitude of any polarity. Furthermore, the amplifier circuit 110 shows a switch S 116 whereby this amplifier circuit may be caused to operate in unit gain, during sampling for example.

Except for this, the circuits of FIGS. 1 and 2 are identical and corresponding elements have the same references.

The comparator circuit 130 of FIG. 2 comprises a comparator amplifier C 133 associated with a reference voltage + VR 1 as previously indicated. It also comprises a second comparator amplifier C 134, whose − input is connected to the input 131 of the comparator circuit 130, and whose + input is connected to the reference voltage − VR 1 of the same amplitude as the voltage + VR 2, but of opposite polarity. The outputs of comparators C 133 and C 134 are combined in OR gates, shown with the reference G 139, whose output is connected to the output line 132 of the comparator circuit 130 for supplying to the digital output channel VN the elementary digital signals representative of the total gain applied to each sample. Correct operation is obtained since a saturation level at the output of either of the comparator amplifiers produces a saturation output level on the output channels VN.

The sampling operation before gain control will now be described with reference to FIG. 2. This operation is carried out with the switch S 116 open, whereas this switch is closed during gain control. It should be understood that this modification for sampling is also applicable to FIG. 1 and to all the proposed embodiments. However, this sampling modification is less interesting when the delay store circuit is not formed of static analogue stores.

The switch S 116 being open for sampling, the switch S 140 is also open, whereas the switch S 150 is closed. In this way, the differential amplifier A 113 has in its circuit only the feedback resistance R 114, without connection of its − input to earth; it has therefore unit gain and supplies to its output the analogue signal of the input channel VE. Sampling is produced by opening of the switch S 123, the sample obtained having thus the amplitude and polarity of the analogue signal at the moment of this opening. This sample is stored in the store M 124 and is immediately transferred to the store M 127 since the opening of the switch S 123 is accompanied by closure of the switch S 126.

After sampling, the switches S 116 and S 140 are closed and the switch S 150 is opened.

At this moment, the sample is applied to the input 111 of the amplifier circuit 110 for gain control, which is carried out as previously indicated.

The devices described up to the present with reference to FIGS. 1 and 2, and in which the delay store circuit is formed of two static analogue stores have modifications which will now be described.

These modifications will be described with reference to FIG. 2, that is to say for analogue samples of both polarities, the samples being obtained in the device itself by means of a switch such as S 116 in FIG. 2.

According to these modifications, not only is transfer from the static store M 127 to the static store M 124 made by means of an amplifier circuit intervening for gain control, but again the transfer from store M 124 to store M 127 is also accompanied by an amplification intervening in the gain control.

Figure 3:
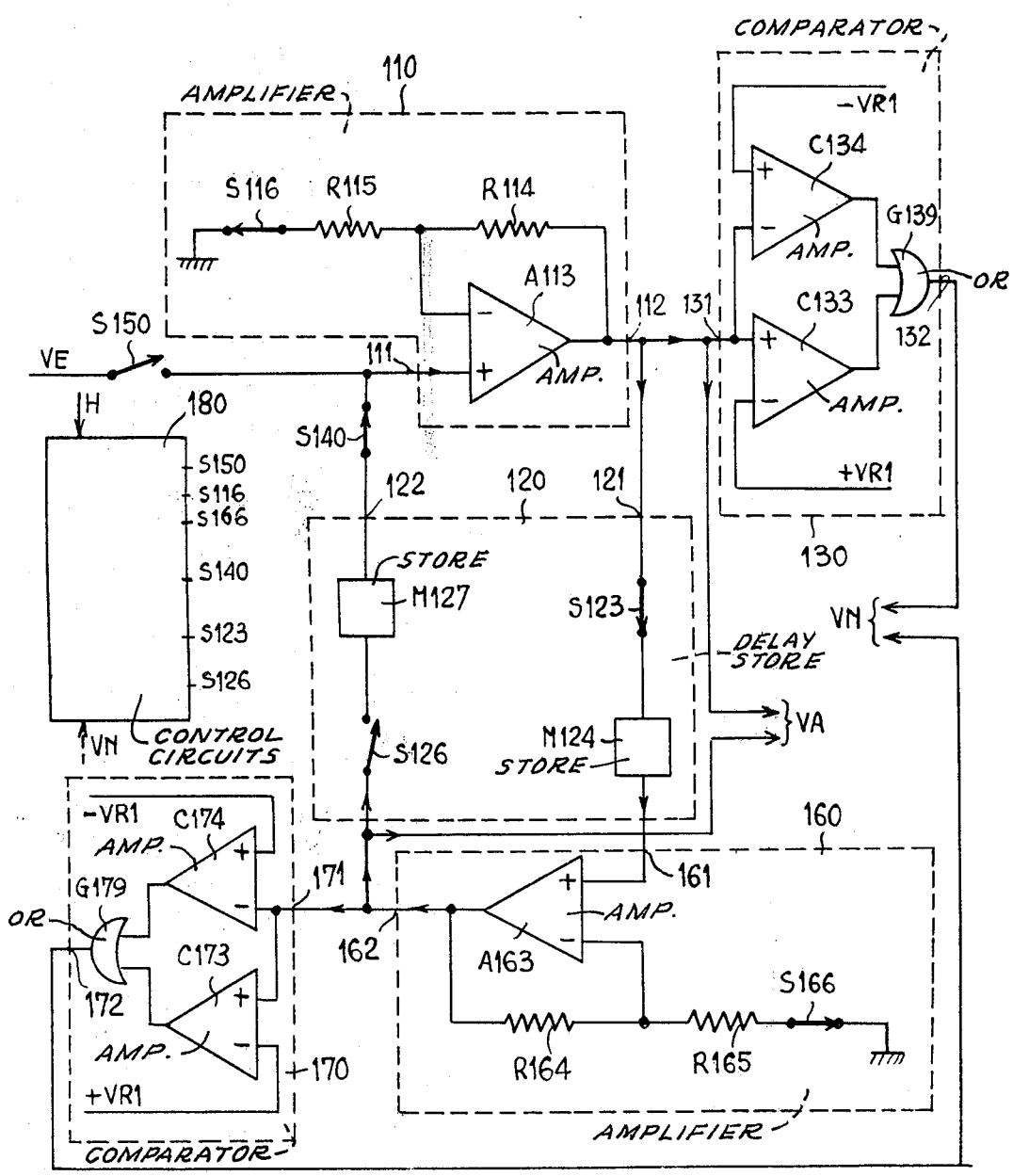
FIG. 3 is the electric circuit diagram of a modification of the device of FIG. 2, providing a higher operational speed.

FIG. 3 shows a first modification of an amplification device with automatic gain control embodying the invention.

According to the modification of this FIG. 3, the unit gain amplifier A 125 is replaced by a second amplifier circuit 160 similar to the first, that is to say, having a signal input 161, an output 162, a differential amplifier A 163 whose + input is the signal input of the amplifier circuit 160 and is connected to the output of the first static store M 124. The output of differential amplifier A 163 is connected by a feedback resistance R 164 to the −input of the said amplifier A 163; finally, this − input is connected to earth via a resistance R 165 and possibly a switch S 166 for sampling. (The switch S 166 is used if the first amplification intervening for gain control is to be carried out by the first amplifier circuit 110.)

The output of amplifier circuit A 163 supplies the output line 162 of the second amplifier circuit 160. This output line is connected on the one hand via the switch S 126 to the input of store M 127, on the other hand possibly to an analogue output channel VA, on the other hand finally to a second comparator circuit 170 similar to the first comparator circuit 130. In FIG. 3, the second comparator circuit 170 therefore comprises two comparator-amplifiers C 173 and C 174 associated respectively with reference voltages having the same amplitude and different polarities. The outputs of the two comparator-amplifiers C173 and C 174 are connected in "OR" gate means G 179 in the same way as for the first comparator circuit 130 of FIG. 3.

Very advantageously, the resistances R 164 and R 165 of the second amplifier circuit 160 have respectively the same values as the resistances R 114 and R 115 of the amplifier circuit 110, such that the gains of the two amplifier circuits 110 and 160 are equal to each other and to the same whole power of 2. In this case, it is also advantageous to give to the reference voltages of the comparator circuits 130 and 170 the same amplitude, that is to say the same absolute value. It is then possible to consider in the same way the output signals of the OR gates G 139 and G 159, which therefore supply the signals representative of the gain to the digital output channel VN.

According to this modification, the amplified sample with the total gain may have to be taken either at the output of amplifier A 113 or of store M 124, either at the output of amplifier A 163 or store M 127, according to whether the first or second comparator circuit 130 and 150 respectively supplies a saturation level. The sample amplified with the total gain may then be supplied to a single analogue output channel VA either by means of switches, controlled for example by the outputs of the comparator circuits (switches not shown), or preferably by causing one of the amplifiers A 113 and A 163 to operate in unit gain by means of one of the switches S 116 and S 166.

In this case, only one of the lines VA shown in FIG. 3 is used, for example the line connected to the output 112 of amplifier A 113, and when the sample amplified with the over-all gain is present at the output of amplifier A 163, which brings a saturation level to the output of the second comparator 170, this saturation level is used for controlling the opening of the switch S 116, for causing the amplifier A 113 to function in unit gain, which then brings the sample, previously amplified with total gain, to the analogue output channel connected to the output 112 of the amplifier A 113.

FIG. 4 shows the device embodying the invention in which the delay store circuit is formed of first and second static analogue stores, each having an input switch and an output or utilisation switch.

This lay-out may be regarded as a modification of that of FIG. 3, in which the function of the first and second amplifier circuits is performed by the single amplifier circuit 110. This amplifier circuit 110 may be either that of FIGS. 2 and 3, or that of FIG. 1, which has no switch S 116. The comparator circuit 130 of FIG. 4 is also the same as that of FIGS. 2 and 3; of course, this could be that of FIG. 1, when the analogue signals are of definite constant polarity.

The delay store circuit 120 of FIG. 4 has its input 121 connected via a first controlled switch S 123 to the first static analogue store M 124, and in parallel via a second controlled switch S 126 to the second static analogue store M 127. The first and second controlled switches S 123 and S 126 must always respect the aforesaid necessary condition, i.e. that one and only one of these switches is closed at any instant.

The output of the first static analogue store M 124 is connected by a utilisation switch S 128 to the output 122 of the delay store circuit 120, and the output of the second static analogue store M 127 is connected via a second controlled utilisation switch S 129 to the said output 122. At the most, one of these two controlled switches S 128 and S 129 is closed at any instant; these two switches S 128 and S 129 are opened simultaneously in the course of the sampling operation, thus performing the function of switch 140 of FIGS. 1 to 3. Outside the duration of sampling, the switches S 128 and S 129 are also subjected to the aforesaid necessary condition: one and only one of them is closed at any instant; furthermore, for each store, the utilisation switch may be opened only when the input switch is closed and vice versa.

One of the static analogue stores, for example M 124, is used for sampling which is then produced by opening of the switch S 123. The switches of the circuit of FIG. 4 at this moment are in the position shown in FIG. 4 and amplification with automatic gain control begins, the sample obtained in the store M 124 being applied to the input 111 of the amplifier circuit 110, while the sample obtained, after a first amplification, at the output of the said amplifier circuit 110, is stored in the second static analogue store M 127.

After the first comparison in the comparator circuit 130, the positions of the four switches of the delay store circuit 120 are respectively reversed, and the gain control is thus carried on in a repetitive manner until a saturation level appears at the output of the comparator circuit 120.

FIG. 5 shows a device for amplification with automatic gain control by discrete values embodying the invention, in which the delay store circuit is formed by a delay line 120, comprising in a manner known per se amplification means (not shown specifically) giving it unit gain. This delay line has a predetermined transit time. The input 121 of delay line 120 is connected directly to the output 112 of the amplified circuit 110. The output 122 of the delay line 120 is connected to the switch S 140, itself connected on the one hand to the input 111 of the amplifier circuit and on the other hand to earth via a resistance R 141.

For the modification of FIG. 5, the comparator circuit 130 is advantageously that of FIG. 1, and the reference voltage + VR 1 has an amplitude equal to that of the full scale conversion voltage Vco divided by the basic gain of the amplifier circuit 110.

In the embodiment of FIG. 5, sampling is preferably carried out by closing the switch S 150 for a time interval slightly less than the transit time interval in the delay line 120.

A difference exists from the sampling point of view between the devices of FIGS. 1 to 4 and the device of FIG. 5. In fact, when the delay store circuit is formed of static analogue stores (FIGS. 1 to 4), the sample taken has for its value that of the analogue signal at a given precise instant, namely the opening of a switch, this value being recorded in a durable manner successively in one and the other of the static analogue stores with intermediate amplification. When, on the contrary, the delay store circuit is formed by a delay line (FIG. 5), the sample taken is a portion of a certain duration cut out of the analogue signal, and in this case the amplitude of the sample may vary according to whether the commencement or end of the said sample is considered. In this second case, therefore, it is advantageous to take into consideration the output levels of the comparator circuit at a selected instant in the duration of the said sample which must be the same for each of the successive operations.

Another difference between the devices comprising static analogue stores and devices comprising a delay line may be explained as follows: In the first devices, the time succession of the operations in the store circuit is controlled by action on the switches of the said store circuit; in the second devices, this succession is established one and for all, taking into account the duration of the sample and of the transit time of the sample in the delay line.

There will now be described devices embodying the invention for carrying out firstly amplification with automatic gain control and then analogue-to-digital conversion.

The operational time diagrams for these devices will be given. These diagrams also illustrate, in their part corresponding to the amplification with automatic gain control, the operation of the devices of FIGS. 1 to 5.

In the figures to follow, it is assumed that the devices embodying the invention comprise a source of time signals H, constructed in a known manner, now shown, and that each control circuit 180 is adapted to generate first of all an amplification signal with automatic gain control by discrete values, or more briefly gain control signal, and then an analogue-to-digital conversion control signal, or more briefly conversion signal, the open or closed position of all or some of the switches depending on the signal thus generated.

It is at once apparent that for the devices embodying the invention comprising two static analogue stores, the control state may be prolonged beyond the end of the gain control operation. Advantageously, this gain control state has a predetermined duration formed by a certain number of time pulses. As a modification, the gain control state is interrupted by the presence of a saturation limit at the output of a comparator circuit. The conversion state may be controlled immediately or with a delay, relative to the gain control state.

For the devices embodying the invention comprising a delay line, it is, on the contrary, necessary that the gain control state should be interrupted immediately after the appearance of a saturation level, and normally immediately following the conversion state. The only operation admissible in this case between the gain control state and the conversion state is an operation of the unit gain amplifier circuit.

The devices according to the invention may utilise for analogue-to-digital conversion two different conversion methods. Each of these two conversion methods will be described respectively with reference to FIGS. 6 and 7. However, it is first necessary to consider the lay-out of the differential amplifier A 113 of the amplifier circuit 110 of FIG. 6. When the switch S 116 is closed, the gain of the amplifier circuit is equal to $$\frac{R\ 114 + R\ 115}{R\ 115}$$

For the gain control period, this gain has been called basic gain; the basic gain is normally equal to a whole power of 2.

The switch S 116 being open and the switch S 118 being closed, the voltage V 112 may be expressed as a function of the voltage V 111 and of the quantification voltage + VQ as follows:

$$V\ 112 = V\ 111 \cdot \frac{R\ 114 + R\ 117}{R\ 117} - (+ VQ)\frac{R\ 114}{R\ 117}.$$

For analogue-to-digital conversion in binary notation, the values of the resistances R 114 and R 117 are selected to be equal, and we have V 112 = 2.V 111 − VQ. As will be seen later, in certain modifications of analogue-to-digital conversion, the differential amplifier A 113 is also used with the voltage VQ replaced by zero voltage, which gives V 112 = 2.V 111. It may be noted that when the gain is equal to 2 (condition R 114 = R 115), it is not necessary to use a supplementary switch for obtaining the relationship: V112 = 2 V 111. For simplification, this hypothesis will be made for most of the devices which are now to be described.

Of course, at the most one of the switches connected to the inverting input of the amplifier a 113 may be closed at any instant.

Concerning the comparator circuit, the same situation appears, namely that the reference value (of one or of both polarities) may be in certain cases (FIG. 10) the same for the gain control operation or for analogue-to-digital conversion. Of course, in normal operation, one and only one of the switches associated with the same comparator amplifier is closed.

With regard to the operation of analogue-to-digital conversion, there also exist two essential modifications, i.e., one in which the reference voltage is zero (FIGS. 6 to 9), and the other according to which the reference voltage is equal in absolute value to the full scale conversion voltage divided by 2 (FIG. 10).

Figure 6:
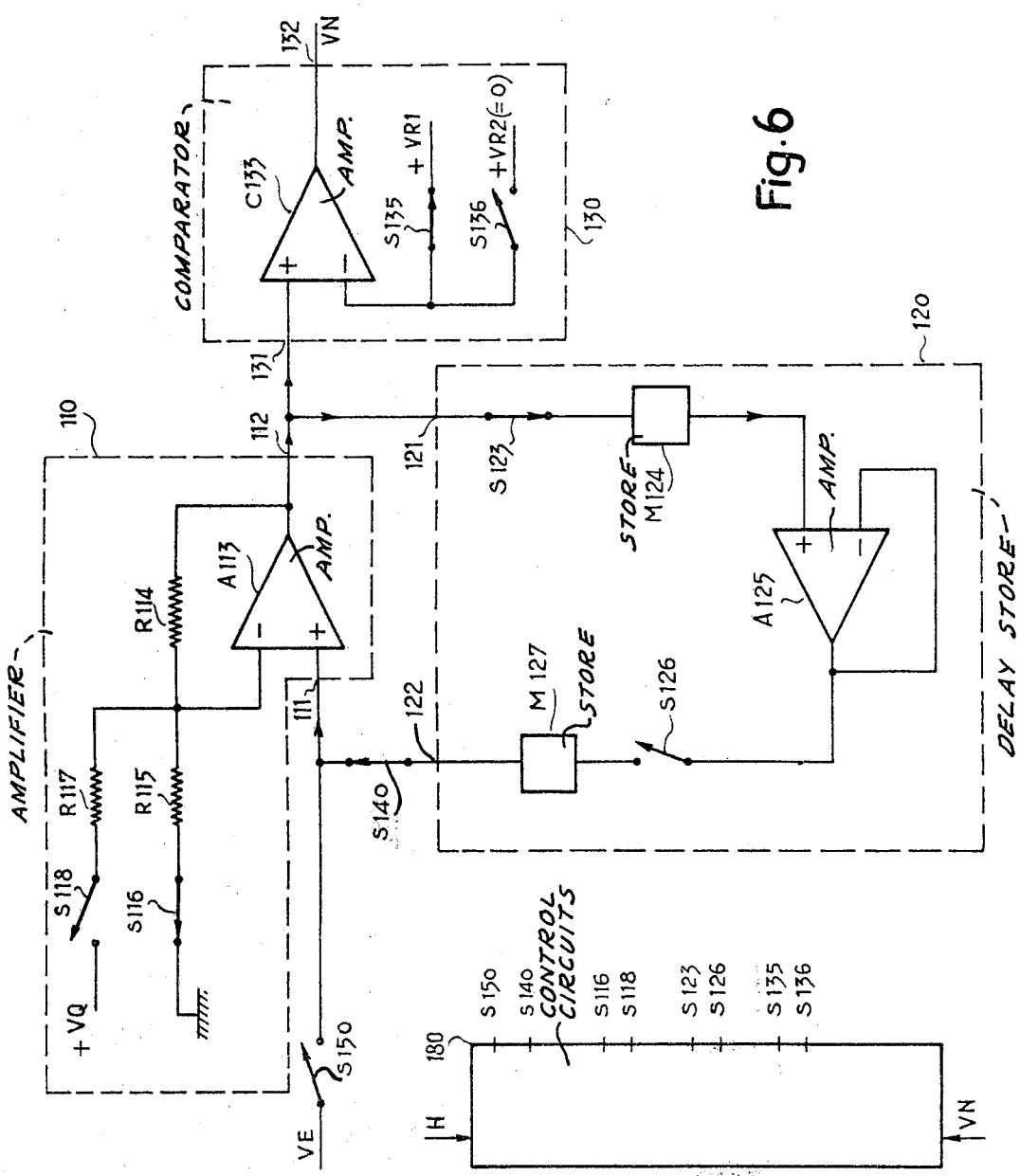
FIGS. 6 to 6B illustrate the electric circuit diagram and operation of a floating point digitiser device embodying the invention for analogue signals of predetermined constant polarity, this device functioning like that of FIG. 1 for gain control.

The digitiser device embodying the invention illustrated in FIG. 6 will not be described.

Before digitisation, the device is waiting, the only switches closed being the switch S 150 and the switch S 123. The differential amplifier A 113 has therefore unit gain. Sampling is then carried out as described with reference to FIG. 2 by opening the switch S 123. The sample stored in the store M 124 is then transferred to the store M 127 by closing the switch S 126, then the switch S 126 is opened again and the device is then put exactly in the same state as that shown in FIG. 1, for the operation of gain control.

This operation of gain control is carried out as described with reference to FIG. 1.

Figure 6A:
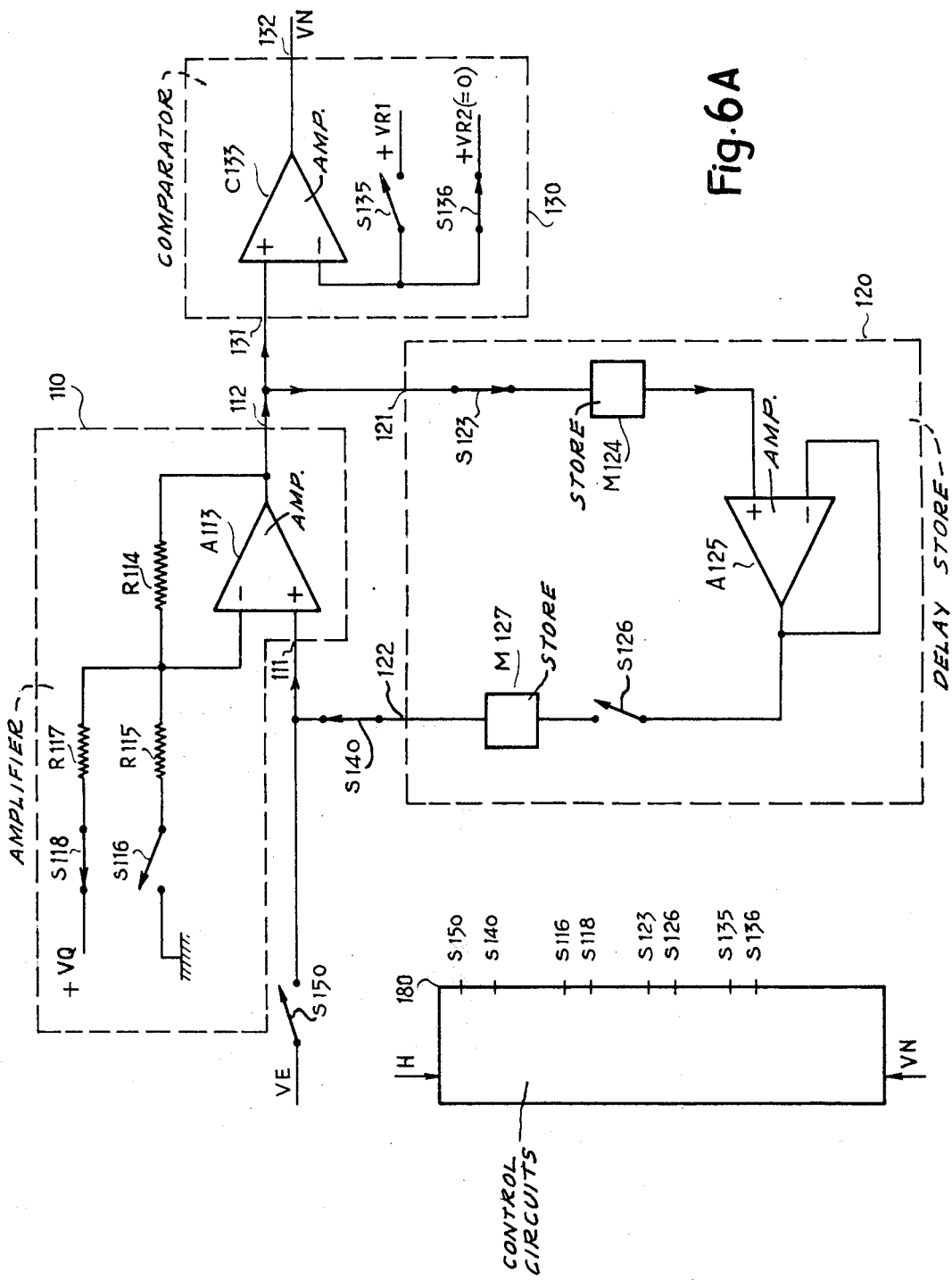

At the end of the gain control operation, the analogue-to-digital conversion operation commences, the switches being then as shown in FIG. 6A.

For the method of conversion used in the device of FIG. 6A, the reference voltage + VR 2 used for analogue-to-digital conversion is equal to zero and conversion is effected as follows, the sample applied to the input of the amplifier circuit being now called U:

Switch S 118 being closed, if the voltage 2.U − VQ available at the output of the amplifier circuit 110 is greater than zero, the first bit of the conversion is 1, and this voltage 2.U − VQ is transferred to the store M 124, then to the store M 127, if, on the contrary, the voltage 2.U − VQ available at the output 112 of the amplifier circuit is negative, the switch S 118 is open and the switch 116 is closed (or again the voltage + VQ is replaced by a zero voltage if the relationship R 114 = R 115 is not verified for gain control), and the voltage stored in store M 124 is then equal to 2.U, this voltage being then transferred to the store M 127. In this case, the conversion bit is 0.

Figure 6B:
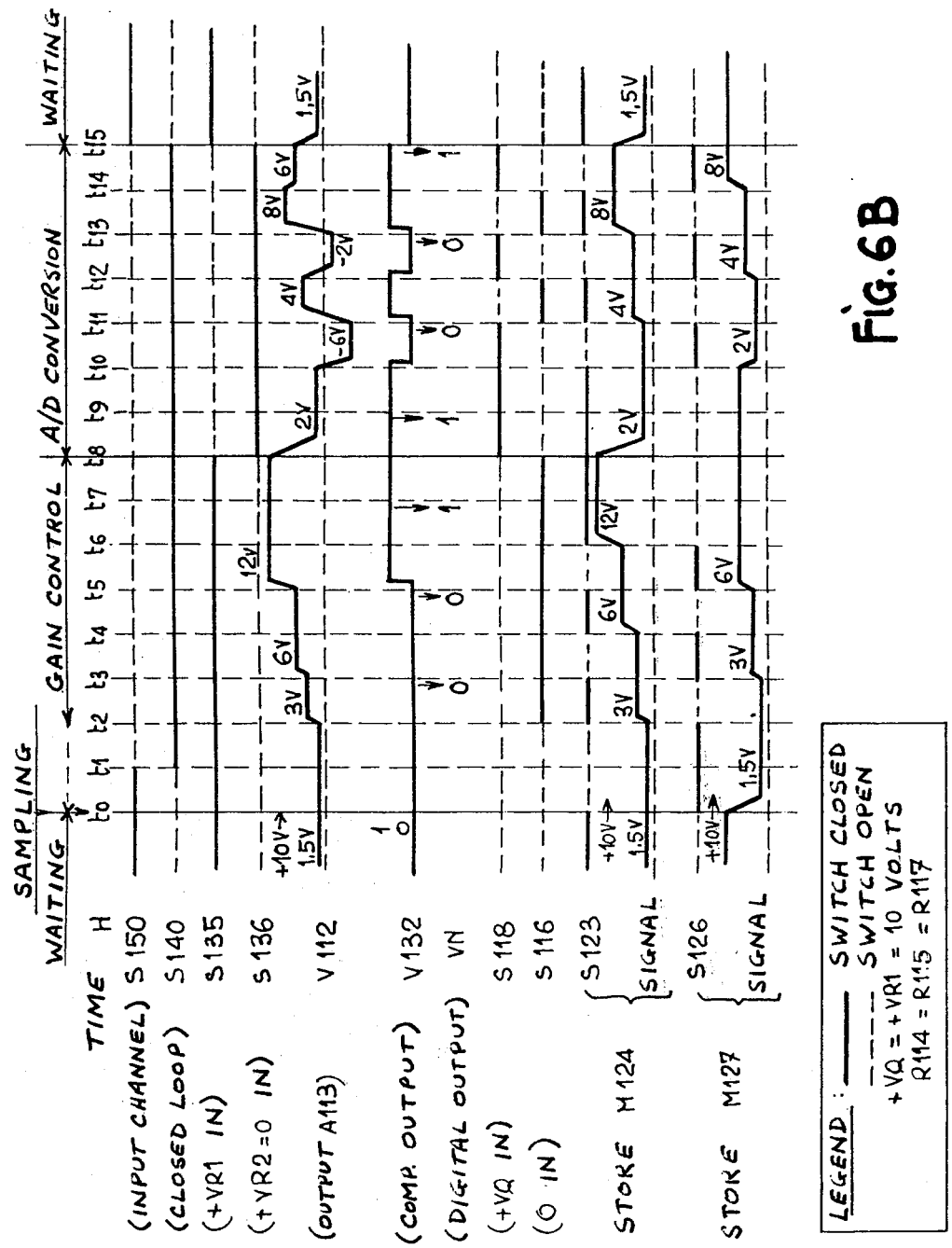

FIG. 6B illustrates in detail the operation of the digitiser circuit of FIGS. 6 and 6A for an input sample whose amplitude is 1.5 volt.

In this figure, closing of a switch is represented by a continuous solid line, while its opening is represented by a short and light dashed line. The voltages + VQ and + VR 1 are both assumed to be equal to 10 volts which is the full scale voltage of analogue-to-digital conversion. Furthermore, the resistances R 114 R 115 and R 117 are assumed to be equal to one another. In this case, the basic gain for gain control is equal to 2. If it were otherwise, an additional switch would have to be provided for example for connecting the resistance R 117 to earth instead of to + VQ; in fact, the resistance R 115 would not, in this case, be equal to the resistance R 117.

We shall now comment upon FIG. 6B. It will be observed that the gain control operation has a fixed duration equal to 8 time periods. This is not absolutely necessary; this duration, as a modification, may depend on the appearance of a saturation level at the output of the comparator; it will also be noted that analogue-to-digital conversion has a fixed duration of 7 time periods, which is selected according to the desired precision.

The time periods will be designated according to the number of their time pulse; for example, the time period t0 extends from the instant t0 to t1:

before t0: waiting stage; all the switches are open except S 150, S 135 and S 123. The analogue signal is assumed equal to + 1.5 volt, this signal being present at the output of the amplifier circuit which then has unit gain (all the switches of this circuit are open); the same signal is present in the store M 124. The store M 127 contains any signal normally included between 0 and + 10 volts.

period t0: opening of S 123 and closing of S 126; the voltage V 112 remains equal to the analogue signal present on the input channel. The store 124 retains the sampled voltage of 1.5 volt; the store M 127 receives this voltage of 1.5 volt.

period t1: opening of S 150 and closing of S 140; the amplifier A 113 now receives the signal from the store M 127, but has still unit gain.

period t2: closing of S 116, change of state of the switches of the stores; commencement of gain control properly so-called. The basic gain being 2, the amplifier A 113 supplies at its output double the voltage 1.5 volt present in the store M 127. This voltage of 3 volts is applied on the one hand to the comparator circuit which therefore keeps its 0 level and it is stored in M 124. At the end of the period 0 bit of gain exists at the digital output. This is the first bit of the characteristic of the digital signal.

period t3: change of state S 123 and S 126; transfer of the voltage of 3 volts from M 124 to M 127 (delay operation). The amplifier circuit supplies 6 volts, but is not yet connected to store M 124.

period t4: change of state of the switches S 123 and S 126. The store M 124 now receives 6 volts; the comparator circuit again supplies an 0 level which gives a second 0 bit for the characteristic.

period t5: change of state of S 123 and S 126, the store M 127 receives 6 volts, the voltage of output V 112 of the amplifier circuit passes to 6 volts. The comparator circuit then supplies a saturation level, the store M 124 does not yet receive 12 volts.

period t6: change of state of S 123 and S 126. At the end of the period, third 1 bit of the characteristic.

It will be noted that the switch S 126 should remain open from the end of the period, during which a saturation level appears at the comparator output, to the end of gain control.

period t7: no switching in the present case. There would be change of state of the switches of the store circuit if the third bit of the characteristic was 0.

period t8: commencement of the conversion stage, change of state of switches S 155 and S 136 of the circuit comparator. Change of state of the switches S 118 and S 116 of the amplifier circuit. The amplifier circuit supplies $2.U - 10$ volts when its input voltage is U and when the switch S 118 is closed. The voltage in M 127 being 6 volts, the amplifier circuit supplies 2 volts, which voltage is applied to the comparator circuit and to the store M 124. The reference voltage of the comparator being now equal to zero, a mantissa 1 bit appears at the end of this period.

period t9: no switching, the first bit being 1. It will be observed that during the conversion stage, store 124 receives the amplified signal after the determination of the mantissa bit; in fact, the nature of the signal retained after the determination of each bit depends on the value of that bit.

period t10: transfer of 2 volts to M 127 by change of state of switches S 123 and S 126. The amplifier circuit supplies $- 6$ volts; the comparator circuit supplies an 0 level, therefore a second 0 bit at the end of the period.

period t11: change of state of the store circuit switches S 123 and S 126, as well as of the amplifier circuit switches S 118 and S 116. In this way, the amplifier circuit supplies $2.U$. The store M 124 therefore receives 4 volts. The comparator circuit supplies a saturation level which is disregarded.

period t12: change of state of switches S 116, S 118, S 123, S 126. The amplifier circuit again supplies $2.U - 10$ volts. The comparator circuit therefore receives $-2$ volts and returns to an 0 level, which supplies at the end the period a third 0 bit for the mantissa.

period t13: new change of state of switches S 123 and S 126 (necessarily), and switches S 118 and S 116, the preceding bit being 0. The store M 124 receives a voltage of 8 volts. The comparator circuit supplies a saturation level which is not taken into consideration.

period t14: change of state of switches S118 and S 116, the preceding bit being 0. The amplifier circuit supplies 6 volts to the comparator circuit, which therefore retains its saturation level. At the end of the period a fourth and last 1 bit is provided for the mantissa.

period t15: return to the waiting position before t0 until the next sampling order: S 123, S 135 and S 150 are closed. All the other switches: S 140, S 136, S 118, S 116, S 126 are open.

Coding of the signal gain by the characteristic bits is as follows:

| | |
|---|---|
| 111 | $2^0$ |
| 011 | $2^1$ |
| 001 | $2^2$ |
| 000 | $2^3$ |

There will now be described with reference to FIG. 7 a second method of analogue-to-digital conversion, for which the reference voltage is zero, but unlike the preceding method, the conversion is effected by systematic subtraction in the amplifier circuit even if the result is negative.

This negative result is recorded as such in the analogue stores; however, when the sample applied to the input of the amplifier circuit is negative, there is subtracted from it a quantification signal which itself is also negative. Since the comparator has detected the fact that this sample is negative, control of the polarity of the quantification signal is therefore effected in response to the comparator output signal.

The person versed in the art will understand that if a sample $2.U$ gives $2.U - VQ$ negative and that if it is processed again while changing the polarity of the signal VQ, which gives $$2 . (2.U - VQ) - (- VQ) \text{ or: } 4.U - VQ$$

this amounts to the same thing as storing the value $2.U$ when the sample is negative and of then subjecting it to a subtraction, the signal VQ being taken with the + sign.

Since the device using this method of conversion may operate with analogue voltages of both polarities, it is very advantageous to supply to it two comparison reference voltages $+ VR 1$ and $- VR 1$ for gain control.

FIG. 7 illustrates the position of the switches at the commencement of the gain control operation; FIG. 7A illustrates the position of the switches at the commencement of the analogue-to-digital conversion operation (determination of the sign), and FIG. 7B illustrates the operation of the devices of FIGS. 7 and 7A, with an input sample of amplitude + 1.5 volt.

For FIG. 7B, which should be read in the same way as FIG. 6B, the following conditions are realised:
VQ = VR 1 = 10 volts.
R 114 = R 117 = 3 × R 115.

The basic gain for gain control is therefore equal to 4 or $2^2$. The number of bits of the characteristic is the same as before. The gain control operation is effected in the same way as for FIG. 6B. However, although the sample is the same, the numerical value of the characteristic is different, since the basic gain which defines the notation weight of the bits of the characteristic is different.

With regard to the analogue-to-digital conversion, the number of bits is equal to 4, plus a first bit corresponding to the determination of the sign.

Since the transfer from the amplifier circuit to the store M 124 is effected without condition, the positions of the switches of the store circuit are changed at each time period.

As pointed out in the foregoing, at the end of the period t12, the comparator indicates that the sample is negative and a 0 bit is generated. At the moment, the switches S 118 and S 119 change state so as to change the polarity of the quantification signal from + 10 volts to − 10 volts.

It will be remarked that during the time period t8, the amplifier A 113 is in unit gain, for determination of the sign, without modification of the value of the sample.

Figure 8:
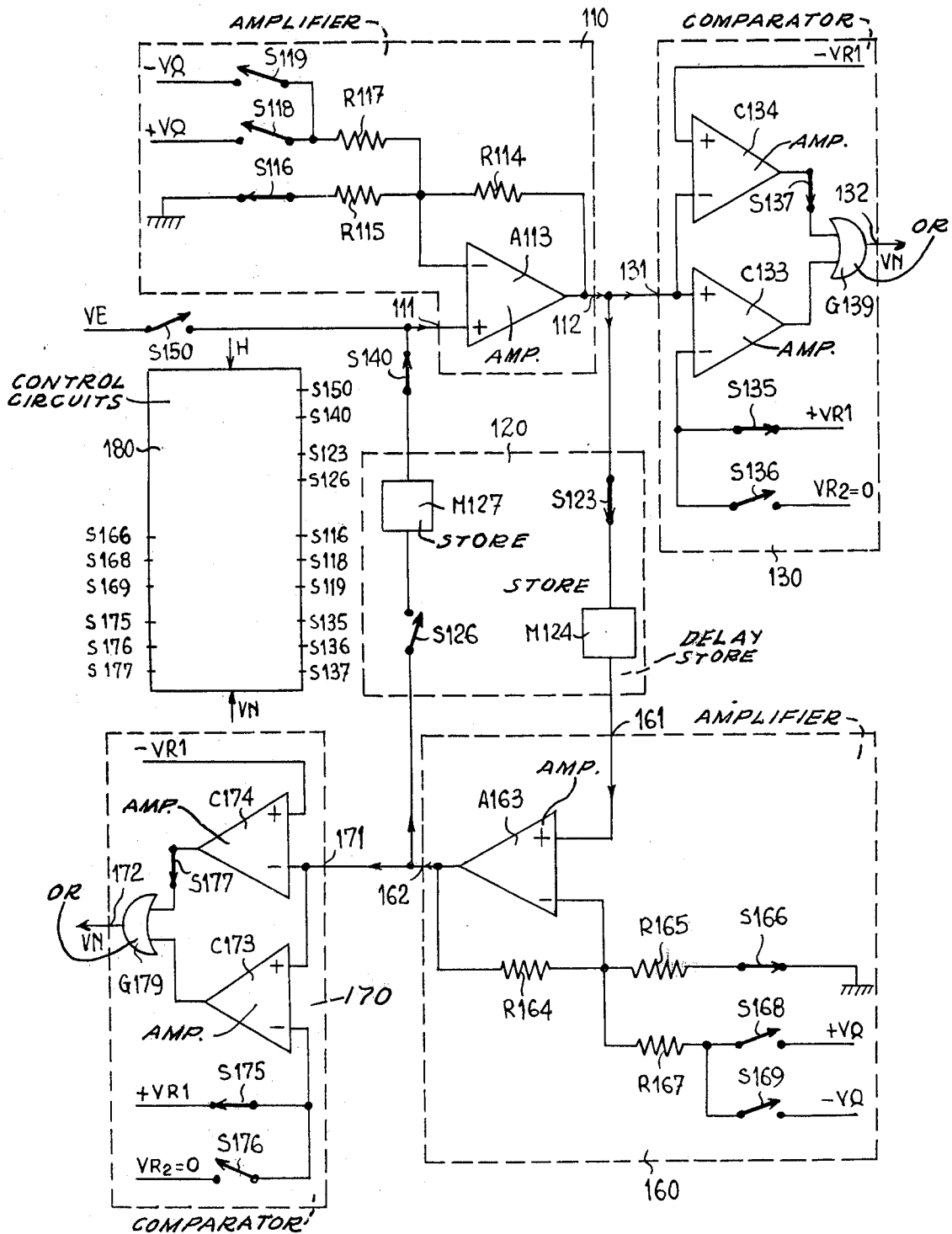
FIGS. 8 and 8A illustrate the electric circuit diagram of a modification of the device of FIGS. 7 and 7A, this device operating like that of FIG. 2 for gain control.
Figure 8A:
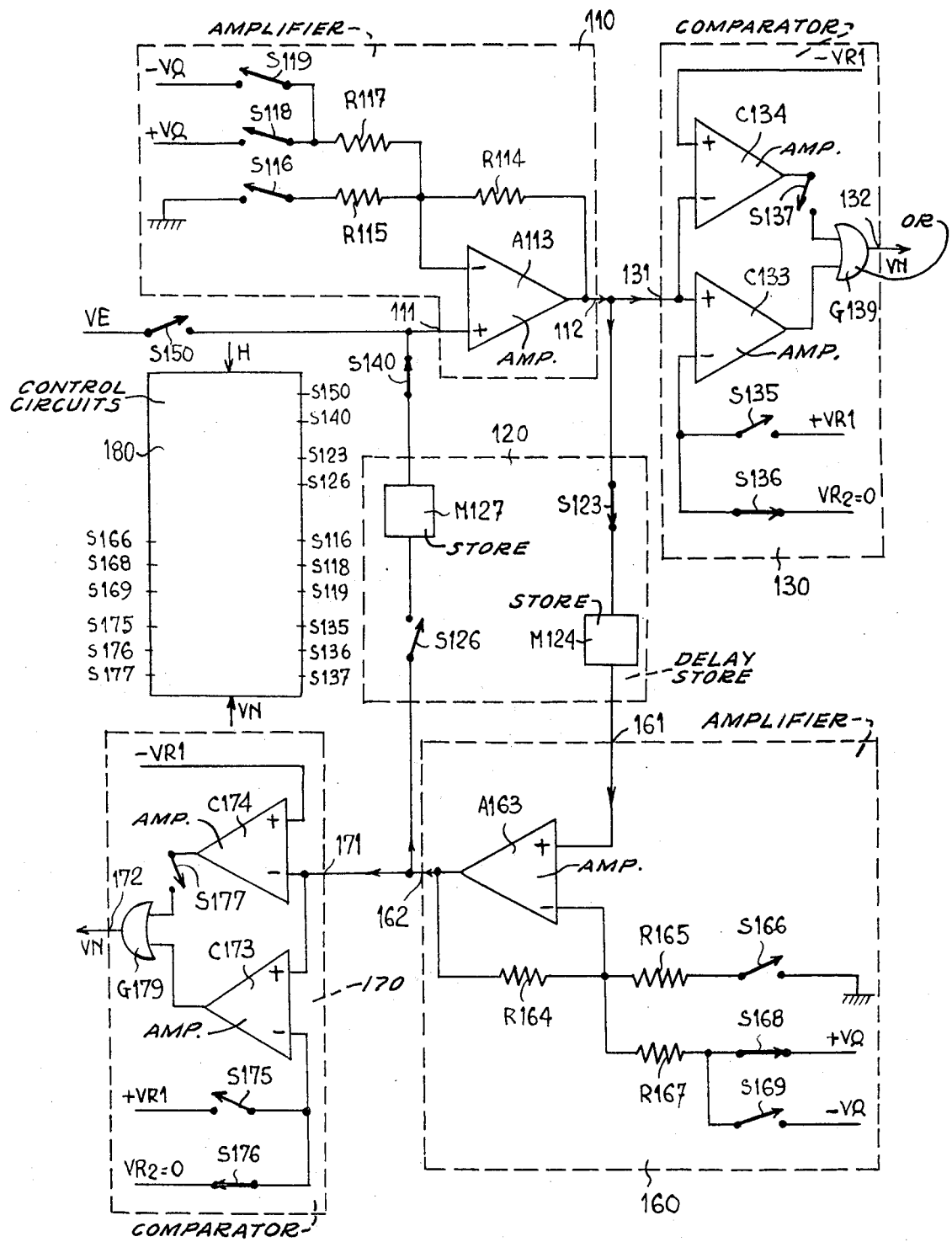

FIGS. 8 and 8A represent a device embodying the invention in which the store circuit is formed of two static analogue stores, and which comprises a second amplifier circuit 160 similar to the first amplifier circuit 110, connected between the output of store M 124 and the input of switch S 126.

FIG. 8 represents the position of the switches at the commencement of the gain search operation; FIG. 8A represents the position of the switches at the commencement of analogue-to-digital conversion. The device of FIGS. 8 and 8A is shown as a modification of the device of FIG. 7 and functions in exactly the same way. The essential advantage of this device is that its speed is doubled, since during two time periods, each of the comparator circuits supplies digital information. In this case, the delay store circuit supplies a delay for the two amplifier circuits alternately.

Very advantageously, the two pairs of amplifier circuits and comparatos are identical for the gain control operation, this being obligatory for analogue-to-digital conversion.

No time diagram has been supplied for the circuit of FIGS. 8 and 8A. This time diagram follows directly from that of FIG. 7B.

FIG. 9 shows another modification of the floating point digitising device according to the invention, in which the same amplifier circuit plays the part of the two amplifier circuits of the device of FIGS. 8 and 8A. As before, FIG. 9 illustrates the position of the switches at the commencement of the gain control operation and FIG. 9 illustrates the position of the switches at the commencement of the analogue-to-digital conversion operation.

FIG. 9B is the operation time diagram of the devices of FIGS. 9 and 9A with the following conditions:
VQ = VB 1 = 10 volts and R 114 = R 117 = 3.R 115.

The input sample has the value of 1.5 volt and the basic gain is the same as for the device of FIGS. 7 and 7B. It will be readily verified that the operation illustrated by the diagram of FIG. 9B is identical with the operation of FIG. 7B.

However, as described with reference to FIG. 4, the two switches S 128 and S 129 are open before sampling. Consequently, these switches respect the aforesaid condition.

FIG. 10 shows a device embodying the invention in which the delay store circuit is formed of a delay line. FIG. 10 shows the position of the switches at the commencement of gain control. FIG. 10A shows the position of the switches at the commencement of analogue-to-digital conversion.

The device shown in these two figures is designed to operate with analogue signals of definite constant polarity. For this device, it has been assumed that the resistances R 114, R 115 and R 117 have equal values. The signal + VQ is equal to 10 volts. The signal + VR is equal to half of 10 volts, i.e., 5 volts. The comparator circuit comprises the same reference signal for gain control and for analogue-to-digital conversion because the basic gain during gain control is equal to 2 (condition R 114 = R 115).

FIG. 10B is a time diagram illustrating the operation of the device of FIGS. 10 and 10A. It will be noted that in this embodiment modification, sampling is obtained by closure of the controlled switch S 150, during a time interval of selected duration, the switch S 140 being open. The transit time of the delay line should be slightly longer than this selected duration. In FIG. 10B, it is assumed that this transit time is equal to two time periods. In any event, it is necessary for the transit time to be in relation with the period of the time pulses.

At the period t0, i.e., during sampling, the amplifier A 113 operates in unit gain, the switches S 116 and S 118 being open. Unlike what has happened in the preceding devices, it is advantageous to determine a first bit of the characteristic according to the value of the initial sample (bit 1 at the instant t1). It will be noted, however, that this should also be done in the preceding devices when the reference signal VR 1 of the comparator circuit is equal to the full scale signal divided by the basic gain.

The gain control operation is carried out as previously described for determining three bits of the characteristic, including the first bit, during sampling. With an input sample of 1.5 volt, the characteristic expressed in digital form is obtained equal to 001.

In a general manner, the total gain coding is obtained as follows:

| | |
|---|---|
| 111 | $2^0$ |
| 011 | $2^1$ |
| 001 | $2^2$ |
| 000 | $2^3$ |

The operation of analogue-to-digital conversion will now be commented upon briefly.

The sample obtained after gain control is always between 5 and 10 volts, except if the gain code or characteristic is 000.

Consequently, when the last bit of the characteristic is 1, the sample amplified with the corresponding total gain control is retained without modification for determining the first bit of the mantissa, the amplifier circuit being then in unit gain (S 116 and S 118 open).

When, on the contrary, the last bit of the characteristic is O, the amplifier circuit 110 is put in gain 2 (S 116 closed) at the commencement of analogue-to-digital conversion (this case is not shown).

The amplifier circuit then receiving a sample of amplitude U responds to the preceding level (bit 1 or 0) supplied by the comparator, while passing respectively either to mode 2.U − VQ (difference relative to the quantification signal) or to mode 2.U (gain 2).

It will be noted that, in a general manner, the fact of taking as reference signal of the comparator circuit the full scale signal divided by the basic gain during the gain control operation, and the full scale signal divided by 2 during analogue-to-digital conversion has, as consequence, that the bits of digital output are obtained earlier relative to the output signal of the amplifier circuit than for the preceding digitisation devices.

In fact, all the devices, for an input sample of 1.5 volt, supply a mantissa 1 001, disregarding the sign. However, the first 0 bit is obtained after the output signal of the amplifier circuit is at 2 volts in FIGS. 6B, 7B and 9B. In FIG. 10B on the contrary, the first 0 bit is obtained while the output signal of the amplifier circuit is equal to 2 volts.

As previously stated, it is possible to apply to all the devices illustrated comparison reference signals in the same waay as for the device of FIGS. 10 to 10B.

It is considered to be accessible to the person versed in the art to construct control circuits of the switches from these time diagrams, while taking into consideration the necessary conditions previously mentioned, by utilising a source of time signals and the output states of the comparator circuit or circuits on the digital output channel VN. These output states are involved in principle only for the analogue-to-digital conversion, except when it is desired to effect gain control not only during a predetermined duration, but until the first reference signal used has been exceeded during this operation.

The controlled switches are preferably field effect transistors of the junction or MOS type, for example known by the disignation 3N 180. The individual control circuits of the open or closed state of these switches may be circuits specially provided for this purpose, such as those sold under the designation DM 8800 by NATIONAL SEMI-CONDUCTOR.

As regards the other components of the devices illustrated, the differential amplifiers will be advantageously of the type $\mu$A741, sold by FAIRCHILD for slow operation, or of the type MC1439, sold by MOTOROLA, or of the type 45 of ANALOG DEVICES for rapid operation.

The comparators may be of the type $\mu$A710 of FAIRCHILD or LM311 of NATIONAL SEMI-CONDUCTOR.

The static analogue stores are low-loss capacitors (dielectric polystyrene, mica or P.T.F.E.) for systems in which the complete digital signal (characteristic and mantissa) comprises less than 10 bits, or sample-and-hold circuits such as the SHA I (rapid) and SHA IV (slow) made by ANALOG DEVICES for high definition (digital output of 15 or 16 bits).

The arrangements illustrated provide a particularly simple electronic device for carrying out amplification with automatic gain control by discrete values of samples of analogue signals. The same device is adapted to carry out also analogue-to-digital conversion of each sample amplified.

The devices illustrated have an essential advantage which is the small number of electronic components used for floating point digitisation. The result is at the same time small bulk and low electric power consumption, and the reliability of the devices is increased at the same time as their simplicity.

It is very interesting to incorporate a device embodying the present invention in any type of transducer or pickup, the pickup thus supplying recurrently a coded signal, partly or totally, in digital form.

A pickup provided with a gain control device embodying the invention supplies recurrently a total gain digital signal, and an analogue sample amplified with the said total gain. Thus, the dynamic range of the signal to be transmitted from the pickup to the measurement information processing device is reduced, which simplifies considerably the problems of signal-to-noise ratio.

A pickup provided with a floating point digitisation device embodying the invention supplies recurrently a digital signal comprising a characteristic and mantissa, and representative of a sample of the analogue signal emanating from the pickup. In addition to the foregoing advantages, a digitiser pickup of this type supplies a signal composed entirely of logical levels and therefore much less sensitive to sources of parasitic noise than the analogue samples.

These devices may be readily incorporated with transducer pickups without greatly increasing their dimensions or their electric power consumption, for forming independent units and particularly digitiser pickups.

Another advantage is that when a number of analogue signals have to be digitised, the speed of the devices depends only on the frequency of sampling each analogue signal and not on the number of those signals.

Another advantage is that the great simplicity of the proposed devices readily permits individual adjustment of these devices for subsequent comparison of analogue signals digitised by different devices.

Of course, the present invention is not limited to the embodiments described, but covers any modification in accordance with its claims. Such modifications may be obtained more particularly by combining the details of the different embodiments described in the foregoing.

We claim:

1. An electronic device for floating point digitisation of samples of analogue signals of constant definite polarity, comprising:

amplifier means operative in a first state with a first predetermined gain from a signal input to an output, and in a second state for selectively supplying on its output either the difference between its signal input amplified by a second gain and a quantification value, or only its signal input amplified by said second gain, depending upon a polarity control;

delay means having an input and an output adapted to be coupled to said output and said signal input of the amplifier means, respectively, for controllably re-circulating the output thereof after a time interval as a signal input to be re-amplified by the amplifier means;

comparator means coupled to the output of the amplifier means and operative in first and second states for indicating when the output of the amplifier means exceeds first and second reference values, respectively; and control means, effective upon application of a sample of an analogue signal to said signal input of the amplifier means, for operating said amplifier means and said comparator means in their respective first states, while repetitively controlling said delay means to re-circulate the output of the amplifier means unless said comparator means indicates that the output of the amplifier means exceeds the first reference value, and for subsequently operating said amplifier means and comparator means in their respective second states, while repetitively controlling said delay means to re-circulate the output of the amplifier means a selected number of times and each time supplying to said amplifier means a polarity control depending upon the indication of said comparator means.

2. A device according to claim 1, wherein the amplifier means comprises a differential amplifier whose non-inverting input is the signal input, whose output is the output of the amplifier circuit, and whose inverting input is connected to the output by a feedback resistance, and coupling means coupling said inverting input in the first state through a resistance to ground, the ratio of the value of the last-named resistance to the value of the feedback resistance being in relation to the said first gain, and said coupling means coupling said inverting input in the second state through a resistance either to a source of a quantification signal representing said quantification value or to ground, depending upon said polarity control, the ratio of the value of the last-named resistance to the value of the feedback resistance being in relation go the second gain.

3. An electronic device according to claim 2, comprising an analogue signal input path and controllable switching means for selectively coupling the signal input of the amplifier means either to the input path or to the output of the delay means, wherein said control means is sequentially operative in a preliminary state and in an effective state for controlling said controllable switching means to couple the signal input of the amplifier means to the input path and to the output of the delay means, respectively, thereby permitting sampling of the analogue signal and subsequent digitisation of each sample with floating point.

4. An electronic device according to claim 3, wherein the coupling means of the inverting input of the differential amplifier to ground each comprises a controllable switch in series on each resistance, and said control means is also operative in said preliminary and effective states for opening and closing respectively, said series controllable switch.

5. A device according to claim 1, wherein the delay means comprises in series a first controllable switch, a first static analogue store, an ampllifier, a second controllable switch, and a second static analogue store, and the control means is effective for normally closing the first controllable swithc and opening the second one, and for repetitively opening the first controllable switch and closing the second one to make the re-circulation, the re-circulation, being repeated in the first state unless the output of the amplifier means exceeds the first reference value, and being made a predetermined number of times in the second state.

6. A device according to claim 5, wherein said comparator means is coupled to the output of the amplifier means through one of the said static analogue stores.

7. A device according to claim 5, wherein the amplifier of the delay means has unit gain, and the closure time of the second switch defines said time interval.

8. A device according to claim 1, wherein said delay means includes in series a first controllable switch, a first static analogue store, another amplifier means, a second controllable switch, and a second static analogue store, the closure times of the first and second controllable swtiches alternately defining said time interval, said other amplifier means being effective in a first state to provide a third predetermined gain from a signal input to an output, and in a second state for selectively supplying on its output either the difference between its signal input amplified by said second gain and said quantification value, or only its signal input amplified by said second gain, depending upon another polarity control, the device further comprising another comparator means coupled to said ooutput of the said other amplifier means and operative in first and second states for indicating when said output of said other amplifier means exceeds a third reference value and said second reference value, respectively, and wherein the control means is alternately effective for closing the first controllable switch and opening the second one while monitoring said comparator means, and for opening the first controllable switch and closing the second one while monitoring said other comparator means, the operation being repeated in the first state unless one of the comparator means indicates that its reference value has been exceeded, and being made a predetermined number of times in the second state, while alternately applying to said amplifier means and said other amplifier means a polarity control depending upon the indication of said other comparator means and said comparator means, respectively.

9. A device according to claim 8, wherein the first and third gains of the amplifier means are equal and the first and third reference values of the comparator means are the same.

10. A device according to claim 1, wherein the delay means comprises two paths in parallel, each having in series a controllable input switch, a static analogue store, and a controllable output switch, and wherein the control means is effective for alternately controlling the switches so that at any instant the input switch of only one of the paths is closed and that, in each path, the output switch is closed only when the input switch is opened, the closure time of the input switches alternately defining the aforesaid time interval, the operation being repeated in the first state unless the comparator means indicates that its reference value is being exceeded, and being made a predetermined number of times in the second state.

11. A device according to claim 1, wherein the delay means comprises a delay line having amplification means for giving it unit gain, the transit time through the delay line defining the aforesaid time interval.

12. A device according to claim 1, having an output path coupled to the output of the comparator means for supplying serial information about the overall gain applied to each sample of analogue signal in said first state, and for subsequently supplying serial information about the digital value of each sample of the analogue signal, in the second state.

13. A device according to claim 1, wherein said second reference value of the comparator means equals said quantification value.

14. The combination of a source of analogue signal samples with a floating point digitizer device according to claim 1, for suplying repetitively a floating point digital signal representative of a sample of the analogue signals of said source.

15. An electronic device for floating point digitisation of analogue signals of any polarity, comprising:
amplifier means operative in a first state with a first predetermined gain from a signal input to an output, and in a second state for selectively supplying on its output its signal input amplified by a second gain either minus or plus a quantification value, depending upon a polarity control;
delay means having an input and an output adapted to be coupled to said output and said signal input of the amplifier means, respectively, for controllably re-circulating the output thereof after a time interval as a signal input to be reamplified by the amplifier means;

comparator means coupled to the output of the amplifier means and operative in first and second states for indicating when the output of the amplifier means exceeds first and second reference values, respectively; and control means, effective upon application of a sample of an analogue signal to said signal input of the amplifier means, for operating said amplifier means and said comparator means in their respective first states, while repetitively controlling said delay means to re-circulate the output of the amplifier means unless said comparator means indicates that the output of the amplifier means exceeds the first reference value, and for subsequently operating said amplifier means and comparator means in their respective second states, while repetitively controlling said delay means to re-circulate the output of the amplifier means a selected number of times and each time supplying said amplifier means with a polarity control depending upon the indication of said comparator means.

16. A device according to claim 15, wherein the amplifier means comprises a differential amplifier whose non-inverting input is the signal input, whose output is the output of the amplifier circuit, and whose inverting input is connected to the output by a feedback resistance, and coupling means coupling said inverting input in the first state through a resistance to ground, the ratio of the value of the last-named resistance to the value of the feedback resistance being in relation to the first gain, and said coupling means coupling said inverting input in the second state through a resistance to a source of a quantification signal having an amplitude representing said quantification value and one or the other polarity depending upon polarity control, the ratio of the value of the last-named resistance to the value of the feedback resistance being in relation to the second gain.

17. An electronic device according to claim 16, comprising an analogue signal input path and controllable switching means for selectively coupling the signal input of the amplifier means either to the input path or to the output of the delay means, wherein said control means is sequentially operative in a preliminary state and in an effective state for controlling said controllable switching means to couple the signal input of the amplifier means to the input path and to the output of the delay means, respectively, thereby permitting sampling of the analogue signal and subsequent digitisation of each sample with floating point.

18. An electronic device according to claim 17, wherein the coupling means of the inverting input of the differential amplifier to ground each comprises a controllable switch in series on each resistance, and said control means is also operative in said preliminary and effective states for opening and closing respectively, said series controllable switch.

19. A device according to claim 15, wherein the delay means comprises in series a first controllable switch, a first static analogue store, an amplifier, a second controllable switch and a second static analogue store, and the control means is effective for normally closing the first controllable switch and opening the second one, and for repetitively opening the first controllable switch and closing the second one to make the re-circulation, the re-circulation being repeated in the the first state unless the output of the amplifier means exceeds the first reference value, and being made a predetermined number of times in the second state.

20. A device according to claim 19, wherein the amplifier of the store circuit has unit gain, the closure time of the second switch defining the aforesaid time interval.

21. A device according to claim 19, wherein said comparator means is coupled to the output of the amplifier means through one of the said static analogue stores.

22. A device according to claim 15, wherein said delay means includes in series a first controllable switch, a first static analogue store, another amplifier means a second controllable switch, and a second static analogue store, the closure times of the first and second controllable switches alternately defining said time interval, said other amplifier means being effective in a first state to provide a third predetermined gain from a signal input to an output, and in a second state for selectively supplying on its output its signal input amplified by said second gain either minus or plus said quantification value, depending upon another polarity control, the device further comprising another comparator means coupled to said output of the said other amplifier means and operative in first and second states for indicating when said output of said other amplifier means exceeds a third reference value and said second reference value, respectively, and wherein the control means is alternately effective for closing the first controllable switch and opening the second one while monitoring said comparator means, and for opening the first controllable switch and closing the second one while monitoring said other comparator means, the operation being repeated in the first state unless one of the comparator means indicates that its reference value has been exceeded, and being made a predetermined number of times in the second state, while alternately applying to said amplifier means and said other amplifier means a polarity control depending upon the indication of said other comparator means and said comparator means, respectively.

23. A device according to claim 22, wherein the first and third gains of the amplifier means are equal and the first and third reference values of the comparator means are the same.

24. A device according to claim 15, wherein the delay means comprises two paths in parallel, each having in series a controllable input switch, a static analogue store, and a controllable output switch, and wherein the control means is effective for alternately controlling the switches so that at any instant the input switch of only one of the paths is closed and that, in each path, the output switch is closed only when the input switch is opened, the closure time of the input switches alternately defining the aforesaid time interval, the operation being repeated in the first state unless the comparator means indicates that its reference value is being exceeded, and being made a predetermined number of times in the second state.

25. A device according to claim 15, having an output path coupled to the output of the comparator means for supplying serial information about the overall gain applied to each sample of analogue signal in said first state, and for subsequently supplying serial information about the digital value of each sample of the analogue signal, in the second state.

26. A device according to claim 15, wherein the amplifier means is controllably switchable into unit gain and the control means is adapted to switch the amplifier means into unit gain at the commencement of the second state for determination of sign.

27. A device according to claim 15, wherein said second reference value of the comparator means is zero.

28. The combination of a source of analogue signals with a floating point digitiser device according to claim 15, for supplying repetively a floating point digital signal representative of a sample of the analogue signals of said source.

* * * * *